US012721191B2

(12) United States Patent
Ghosh et al.

(10) Patent No.: US 12,721,191 B2
(45) Date of Patent: Aug. 25, 2026

(54) BACK SIDE POWER DELIVERY FOR WAFER-SCALE INTEGRATION WITH SOLDERLESS MODULAR POWER SUBSTRATES

(71) Applicant: Volantis Semiconductor, Inc., Portland, OR (US)

(72) Inventors: Tapabrata Ghosh, Oakland, CA (US); Kevin Nan Lam, Pleasanton, CA (US)

(73) Assignee: Volantis Semiconductor, Inc., Portland, OR (US)

( * ) Notice: Subject to any disclaimer, the term of this patent is extended or adjusted under 35 U.S.C. 154(b) by 59 days.

(21) Appl. No.: 19/023,647

(22) Filed: Jan. 16, 2025

(65) Prior Publication Data

US 2026/0123467 A1 Apr. 30, 2026

Related U.S. Application Data

(63) Continuation-in-part of application No. 18/978,188, filed on Dec. 12, 2024, which is a (Continued)

(51) Int. Cl.
*H10W 20/00* (2026.01)
*H05K 1/181* (2026.01)
(Continued)

(52) U.S. Cl.
CPC .......... *H10W 70/611* (2026.01); *H05K 1/181* (2013.01); *H10W 42/121* (2026.01); *H10W 70/635* (2026.01); *H10W 70/65* (2026.01); *H10W 90/00* (2026.01); *H10W 90/401* (2026.01); *H10W 90/701* (2026.01); *H05K 2201/10378* (2013.01)

(58) Field of Classification Search
CPC ... H10W 20/00; H10W 20/01; H10W 20/021; H10W 20/023; H10W 20/0249; H10W 20/0253; H10W 70/611; H10W 70/614; H10W 70/635; H10W 70/65; H10W 90/00; H10W 90/701; H05K 1/181
USPC ................. 257/678, 691, 734, 784, E23.001
See application file for complete search history.

(56) References Cited

U.S. PATENT DOCUMENTS

| | | | |
|---|---|---|---|
| 9,886,193 | B2 | 2/2018 | Berger et al. |
| 10,332,931 | B2 | 6/2019 | Cassidy et al. |

(Continued)

*Primary Examiner* — Hai L Nguyen
(74) *Attorney, Agent, or Firm* — Adams Intellex, PLC

(57) ABSTRACT

Techniques for power delivery are disclosed. A wafer-scale silicon interposer (WSSI) is accessed. A front side of the WSSI is bonded to a plurality of functional chips. The WSSI includes a plurality of through-silicon vias (TSVs). A plurality of modular power substrates (MPSs) is connected mechanically to a unified control board (UCB). The UCB includes a plurality of DC-to-DC power converters. The plurality of MPSs is attached to a back side of the WSSI. The attaching is based on a plurality of compression connectors. The attaching is based on a compression force from the UCB. The attaching couples each MPS to one or more functional chips within the plurality of functional chips. DC power is sent, by the UCB, to the plurality of functional chips. The sending is based on the plurality of DC-to-DC power converters, the plurality of MPSs, and the plurality of TSVs.

26 Claims, 14 Drawing Sheets

Related U.S. Application Data continuation-in-part of application No. 18/958,107, filed on Nov. 25, 2024, which is a continuation-in-part of application No. 18/940,944, filed on Nov. 8, 2024.

(60) Provisional application No. 63/720,216, filed on Nov. 14, 2024, provisional application No. 63/714,353, filed on Oct. 31, 2024.

(51) Int. Cl.

| | |
|---|---|
| ***H10W 42/00*** | (2026.01) |
| ***H10W 70/60*** | (2026.01) |
| ***H10W 70/63*** | (2026.01) |
| ***H10W 70/65*** | (2026.01) |
| ***H10W 90/00*** | (2026.01) |

(56) References Cited

U.S. PATENT DOCUMENTS

| | | | | |
|---|---|---|---|---|
| 10,613,754 | B2 | 4/2020 | Berger et al. | |
| 11,328,208 | B2 | 5/2022 | Lie et al. | |
| 12,532,730 | B2 * | 1/2026 | Ahn | H10P 74/273 |
| 12,568,814 | B2 * | 3/2026 | Ghosh | H10W 20/20 |
| 12,575,400 | B2 * | 3/2026 | Lanzillo | H10W 20/42 |
| 2020/0258838 | A1 | 8/2020 | Ghosh | |

* cited by examiner

BACK SIDE POWER DELIVERY FOR WAFER-SCALE INTEGRATION WITH SOLDERLESS MODULAR POWER SUBSTRATES

RELATED APPLICATIONS

This application is a continuation-in-part of U.S. patent application “Wafer-Scale Integration With A Stiffening Isometric Grid Array” Ser. No. 18/978,188, filed Dec. 12, 2024, which claims the benefit of U.S. provisional patent applications “Cooling for Wafer-Scale Integration With Back Side Power Coupling” Ser. No. 63/714,353, filed Oct. 31, 2024, and “Back Side Wafer-Scale Power Delivery With An Anisotropic Film” Ser. No. 63/720,216, filed Nov. 14, 2024.

The U.S. patent application “Wafer-Scale Integration With A Stiffening Isometric Grid Array” Ser. No. 18/978,188, filed Dec. 12, 2024 is also a continuation-in-part of U.S. patent application “Cold Plate Cooling For Wafer-Scale Integration With Back Side Modular Power Delivery” Ser. No. 18/958,107, filed Nov. 25, 2024, which claims the benefit of U.S. provisional patent applications “Cooling for Wafer-Scale Integration With Back Side Power Coupling” Ser. No. 63/714,353, filed Oct. 31, 2024, and “Back Side Wafer-Scale Power Delivery With An Anisotropic Film” Ser. No. 63/720,216, filed Nov. 14, 2024.

The U.S. patent application “Cold Plate Cooling For Wafer-Scale Integration With Back Side Modular Power Delivery” Ser. No. 18/958,107, filed Nov. 25, 2024 is also a continuation-in-part of U.S. patent application “Back Side Wafer-Scale Integration With Modular Power Delivery” Ser. No. 18/940,944, filed Nov. 8, 2024, which claims the benefit of U.S. provisional patent application “Cooling for Wafer-Scale Integration With Back Side Power Coupling” Ser. No. 63/714,353, filed Oct. 31, 2024.

FIELD OF ART

This application relates generally to power delivery and more particularly to wafer-scale integration with a stiffening isometric grid array.

BACKGROUND

For millennia, humans have fastened objects to each other. Whether attaching a stone with a chipped, sharpened edge to a wooden shaft, or mounting a balance bridge with a bimetallic balance wheel and a silicon hairspring to a watch main plate using a precision screw, humans have sought techniques of attaching, connecting, or otherwise fastening objects together. Continuing with the stone and wooden stick, humans quickly learned that simply pressing the stone into a hole in the wood was neither reliable nor durable. One solution what was widely used consisted of using sinew from a harvested animal to bind the stone to the wooden shaft. This technique was found to be relatively easy to execute and quite reliable until the sinew got wet, was abraded against a harder object, or otherwise damaged. While the materials to repair the wood and stone object could be obtained and a new object made, this fastening technique required frequent repair. Advancements were achieved in both the materials of the objects to be attached and the techniques for attaching the objects. The advancements enabled improved structures, stronger and more reliable objects, and so on. The objects could be precisely fitted thereby creating a good mechanical connection. The connections could be secured using pegs made of wood or bone, fasteners such as nails, screws or bolts, and so on.

In the modern age, the concepts of forming connections between components has extended to connections between and among electrical and electronic circuits and systems. In a device such as a computer, integrated circuits, disk drives, networking equipment, power supplies, and so on are connected together so that the computer can operate. Some of the components can be grouped together in a single element. The single element can include “built in” wiring, thereby obviating the need for connectors, fasteners, etc. between the components. Other elements must be connected together, where the connections can include wires and cables that pass between the elements. Some connections can be “permanent” connections. These connections include soldered and welded connections, which enable reliable electrical connection but are not disconnected easily. Soldered connections, for example, can be undone by applying heat to melt the solder, but such undoing a connection is time consuming and inconvenient. Other connections can be accomplished using a connector. The connector can be used to connect wires and cables between elements. These connections can be reliable and can be undone as needed. The disconnecting of this latter type of connection can be accomplished by pulling, twisting, unclicking, the connectors to separate the connected elements. Thus, connections can be made or unmade to enable ease of repair or upgrade of elements.

SUMMARY

Business operators, consumers, researchers, and scientists have long demanded computers and various consumer devices that are faster and more capable than prior generations of similar devices. In order to meet these market pressures, circuit designers have long been driven to design and fabricate improved integrated circuits with ever-increasing processing performance, expanded data processing options, and “product differentiating” features. The latter features now commonly include larger touchscreens, higher resolution cameras, spatial audio, and biometric sensing, among many other enhancements. However, increasing chip processing speed and capability by introducing advanced parallel processing architectures, incorporating graphics processors, or including neural engines all force the addition of complex and potentially large circuitry to the chips. To add new circuitry into chips, designers have long explored two main options: increase the chip dimensions by making the chip larger, or increase circuit density by reducing feature sizes. Ideally, the chip would be the size of an entire wafer, and the feature sizes would include greatly reduced wire widths and separation, smaller transistor sizes, minimum contact sizes, and reductions of all other dimension related to circuity.

Engineers have continued to increase circuit density and to place more transistors on a chip in order to meet to never-ending customer demands for increased performance. Further, engineers are attempting to produce chips that are closer to the size of an entire wafer on which the chips are fabricated. As a result, microprocessors, graphics processors, machine learning accelerators, systems-on-chips (SoCs), and so on currently boast transistor counts into the tens of billions. Commensurate with increasing performance, these improvements and added devices increase the power density of the chips, resulting in significant heat generation. Further, to increase interconnection options, designers have considered through-silicon vias to provide direct connections between a front side of a chip (or wafer)

and a back side of a chip. However, to reliably fabricate such interconnect, the wafers, for example, must be ground or polished to a thinness that supports the fabrication of the through-silicon vias. As a result, the thinned chips are prone to cracking and fracturing, not only because of the delicate nature of the materials of the wafer, but also because of the weights of any elements bonded to, attached to, or otherwise connected to the wafers. Thus, proper support and stabilization of the wafers has become paramount to prevent wafer damage or wafer failure.

Disclosed techniques enable back side power delivery for wafer-scale integration with solderless modular power substrates. A wafer-scale silicon interposer (WSSI) is accessed. A front side of the WSSI is bonded to a plurality of functional chips. The functional chips can include processor chips, accelerator chips, memory chips, and so on. The WSSI includes a plurality of through-silicon vias (TSVs). A plurality of modular power substrates (MPSs) is mechanically connected to a unified control board (UCB). The UCB can provide instructions, control signals, and the like. The UCB includes a plurality of DC-to-DC power converters. The DC-to-DC converters convert a DC voltage to a first DC voltage. The plurality of MPSs is attached to a back side of the WSSI. The attaching is based on a plurality of compression connectors. The compression connectors can include spring-loaded pins, wire nests, elastomer connectors with embedded balls, and cantilever contacts. The attaching is based on a compression force from the UCB. The compression force can be applied using a compression plate associated with the UCB. The attaching couples each MPS to one or more functional chips within the plurality of functional chips. Each MPS can include one or more DC-to-DC converters. The DC-to-DC converters associated with the MPS can convert the first DC voltage to a second DC voltage. The coupling each MPS can be accomplished using the TSVs and interconnect associated with the WSSI. DC power is sent, by the UCB, to the plurality of functional chips. The sending is based on the plurality of DC-to-DC power converters, the plurality of MPSs, and the plurality of TSVs.

A method for power delivery is disclosed comprising: accessing a wafer-scale silicon interposer (WSSI), wherein a front side of the WSSI is bonded to a plurality of functional chips, wherein the WSSI includes a plurality of through-silicon vias (TSVs); connecting mechanically a plurality of modular power substrates (MPSs) to a unified control board (UCB), wherein the UCB includes a plurality of DC-to-DC power converters; attaching, to a back side of the WSSI, the plurality of MPSs, wherein the attaching is based on a plurality of compression connectors, wherein the attaching is based on a compression force from the UCB, and wherein the attaching couples each MPS to one or more functional chips within the plurality of functional chips; and sending DC power, by the UCB, to the plurality of functional chips, wherein the sending is based on the plurality of DC-to-DC power converters, the plurality of MPSs, and the plurality of TSVs.

Various features, aspects, and advantages of various embodiments will become more apparent from the following further description.

BRIEF DESCRIPTION OF THE DRAWINGS

The following detailed description of certain embodiments may be understood by reference to the following figures wherein.

DETAILED DESCRIPTION

Figure 1:
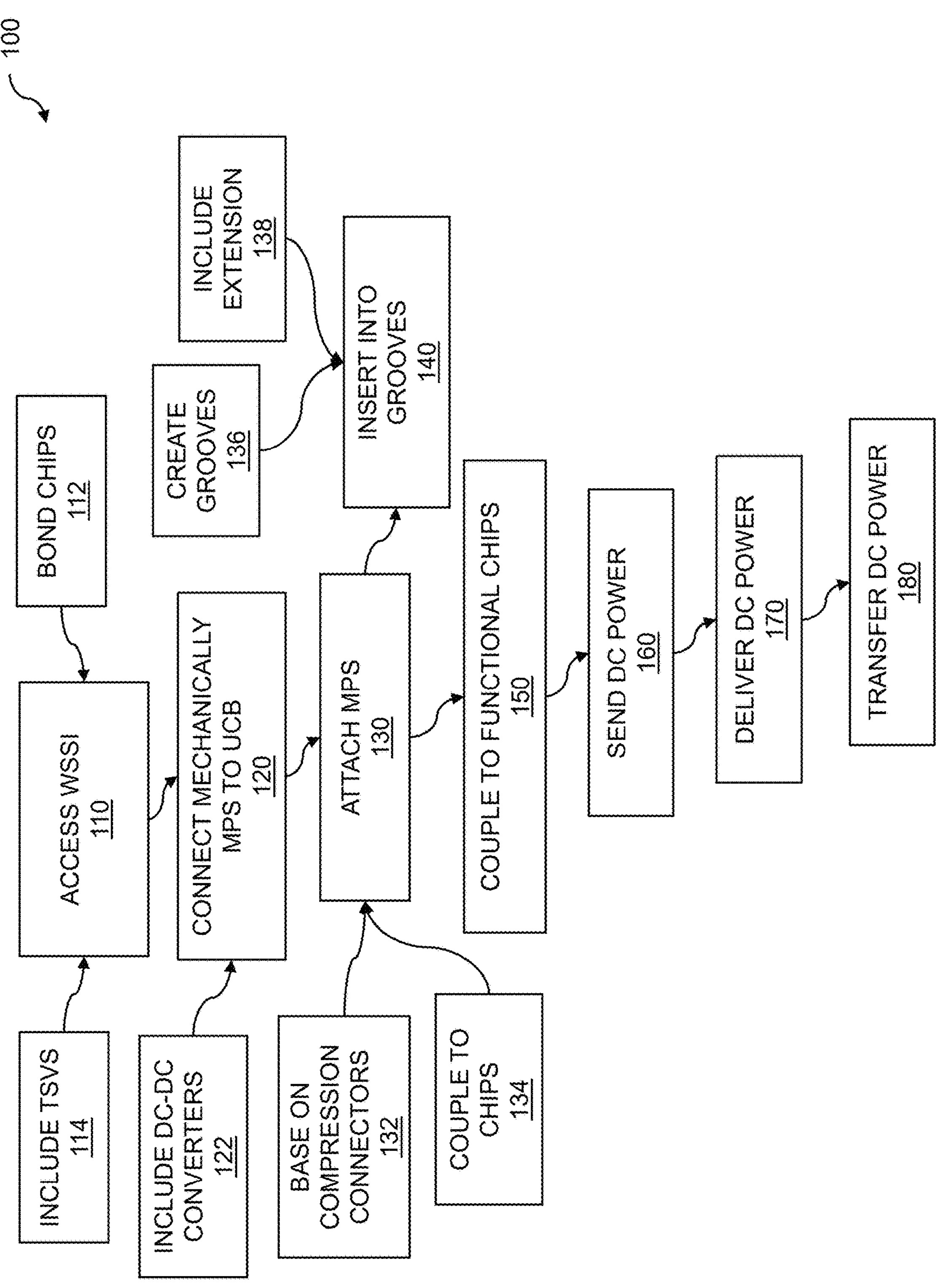
FIG. 1 is a flow diagram for back side power delivery for wafer-scale integration with solderless modular power substrates.

Techniques using back side power delivery for wafer-scale integration with solderless modular power substrates are disclosed. Demand for significant processing performance improvements has soared, correlating with the development of new applications for processors, accelerators, and so on. This demand is placing immense pressure on designers to develop next generation chips that can provide power to computers, servers, cloud servers, large language model (LLM) engines, etc. To meet these demands, vastly increased numbers of transistors have been added to chips such as systems-on-chip (SOCs). SOCs can include a wide range of circuitry which can include processors, memories, I/O circuits, and other elements. These SOCs can be dimensionally large, possessing tens of billions of transistors. At the same time, the feature sizes of the transistors used for these large chips continue to shrink. In fact, according to Moore's law, the number of transistors that can fit into the same size chip should double every two years. While at some point, this doubling may end as the limits of lithography and physics are approached, in general, the "law" has held true for the last several decades. Keeping chip sizes roughly the same size while increasing transistor count is generally good news, but new technologies that drive smaller transistors also impose new challenges for designers. For example, as a transistor shrinks, leakage currents can increase, driving larger power consumption for the chip. This effect, in combination with the active power required for billions of transistors, can drive extremely high-power densities for processors and other computing elements. In addition, the wafers on which these large chips are fabricated are delicate. The wafers can crack and fracture if the wafers are not properly handled and supported.

The immense increase of interest in and use of artificial intelligence (AI) applications, such as large neural networks, transformers, and so on, can require hundreds or even thousands of processing elements. The processing elements handle the perhaps trillions of computations required by the AI applications. These processing elements can include processor cores, multiprocessor cores, matrix computation accelerators, SOCs, and so on. While multiple cores such as processor cores and memory cores can be included on the same chip, many chips are required for executing these computationally intensive applications. The processing chips can be in communication with other processing chips that are located locally and remotely. The processing chips are typically coupled via cards, racks, and data centers. The chips, when taken together, introduce significant design challenges such as the provision of power to the chips, the cooling of all these chips, etc. For example, cooling has become a complex challenge, especially when thermal design power (TDP), a measurement of the maximum power consumed by a chip under normal operating conditions, continues to increase.

Technologies are being developed that improve performance of AI applications and models. For example, wafer-scale integration is an approach that holds promise to address the highly demanding performance requirements, with a particular focus on the data transfer bandwidth needs of AI and other applications. Wafer-scale integration can include using a wafer as an interposer to couple many functional chips. The chips can include AI accelerators; processors and multicore processors; SOCs; application-specific integrated circuits (ASICS); memory chips such as SDRAM, DDR1, DDR2, DDR3, DDR4, DDR5 and high bandwidth memory (HBM); and so on. The functional chips can be coupled by wiring paths within the wafer interposer. The wafer interposer can be processed using a back-end-of-line (BEOL) wafer process which can include any number of metal layers. These metal layers can be used to couple any AI accelerator to any memory controller on the interposer. The wafer metal layers can provide extremely high bandwidth communication between any element included on the interposer such as memory controllers, AI processors, etc., due at least in part to short communications paths. While such technology can address the performance challenges associated with extremely compute-intensive and high bandwidth applications such as AI acceleration, challenges exist for their use in production. For example, a wafer interposer can be brittle and difficult to handle, especially with a plurality of functional chips bonded to a front side. Further, the coplanarity of the wafer interposer can vary, resulting in less-than-optimal electrical connections across the front side and back side. Grinding, which can enable technologies such as through-silicon vias (TSVs), can thin the wafer interposer, making it still more difficult to handle without cracking. A further challenge arises in the connections between all layers of the wafer-scale integration (WSI) system. For example, chips on the top of the interposer can be flip-chip mounted via controlled collapse chip connections (C4s), microbumps, and so on to the interposer. However, for delivering power, larger DC power transformers often require soldering to the back-side of the interposer. The soldering process can include an oven which can crack or destabilize other C4s or microbumps attached to the interposer. These issues present a substantial technical challenge for the handling, assembly, and operation of wafer interposers.

To address the significant risks while providing power to the wafer interposer described above, back side power delivery for wafer-scale integration with solderless modular power substrates is disclosed. A wafer-scale silicon interposer (WSSI) is accessed. A front side of the WSSI is bonded to a plurality of functional chips. The WSSI includes a plurality of through-silicon vias (TSVs). The TSVs provide connectivity between a front side of the WSSI and a back side of the WSSI. A plurality of modular power substrates (MPSs) is connected mechanically to a unified control board (UCB). The UCB includes a plurality of DC-to-DC power converters. The DC-to-DC power converters can convert a higher DC voltage to a lower DC voltage. The lower voltage can enable operation of the functional chips on the WSSI. The plurality of MPSs is attached to a back side of the WSSI. The attaching is based on a plurality of compression connectors. The attaching is based on a compression force from the UCB. The attaching couples each MPS to one or more functional chips within the plurality of functional chips. DC power is sent, by the UCB, to the plurality of functional chips. The sending is based on the plurality of DC-to-DC power converters, the plurality of MPSs, and the plurality of TSVs. The sending includes delivering the DC power, by the UCB, to the plurality of MPSs. The delivering includes a first voltage conversion. The DC power that was delivered, by the plurality of MPSs, is transferred to the plurality of functional chips. The transferring includes a second voltage conversion. The second voltage conversion can produce a DC voltage below a threshold such as 1 volt.

A cold plate can be attached to the plurality of functional chips to cool the functional chips. The cold plate comprises an inlet plate, a jet-plate, and a fin-plate. Coolant at a first temperature can be sent into at least one inlet nozzle located on the inlet plate. The sending can include spraying the coolant, by the jet-plate, on the fin-plate. At least a portion of the heat that was created can be transferred, by the cold plate, to the coolant that was sent. The coolant can be captured, at a second temperature, from one or more outlet chambers within the jet-plate.

FIG. 1 is a flow diagram for back side power delivery for wafer-scale integration with solderless modular power substrates. The flow 100 includes accessing a wafer-scale silicon interposer (WSSI) 110. Wafer-scale integration has been a long-sought goal of integrated circuit design. With wafer-scale integration, an entire wafer such as a silicon wafer could be used to fabricate one large integrated circuit. However, since physical defects in the silicon wafer are distributed across the wafer, portions of circuitry which were fabricated over the defects would likely not function properly. In addition, errors that occur when fabricating the many layers that form the integrated circuit further create portions of the integrated circuit that would likely not function. Instead, by attaching or bonding a plurality of integrated circuits to the WSSI, wafer-scale integration can be achieved, which can also allow chips from different manufacturing processes to be included. In this case, the wafer can be used as an interposer to couple the integrated circuits. The wafer can be a 300 mm wafer, a 200 mm wafer, or a wafer of another size. The wafer can comprise silicon or another suitable material. In a usage example, another suitable material can include glass. The wafer can include any amount of front-end-of-line (FEOL) processing and/or back-end-of line (BEOL) processing. The processing can be based on Complementary Metal-Oxide-Semiconductor (CMOS), Silicon on Insulator (SOI), or another process.

In the flow 100, a front side of the WSSI is bonded to a plurality of functional chips 112. The WSSI can have a front side and a back side onto which elements such as the functional circuit elements can be attached or bonded. The functional chips can include general purpose chips such as processor chips, multiprocessor chips, graphics processor chips, application-specific integrated circuits (ASICS), memory chips, and so on. In embodiments, the plurality of functional chips includes one or more artificial intelligence (AI) accelerators. The AI accelerators can be used for applications such as machine learning; natural language processing; image, video, and audio processing; etc. In embodiments, the plurality of functional chips includes one or more memory devices. In the flow 100, the WSSI includes a plurality of through-silicon vias (TSVs) 114. A TSV can include an electrical connection that completely passes through a wafer such as a silicon wafer, a glass wafer, a die, and so on. The plurality of TSVs can be oriented vertically in order to enable connections between the front side of the wafer and the back side of the wafer. Chips such as the functional chips can be positioned such that connections to the chips align with the TSVs. In some examples, a wafer can be ground to enable TSV processing with repeatable shapes and parasitic characteristics.

In exemplary implementations, the WSSI can comprise a monolithic wafer. The monolithic wafer can include a plurality of functional cores that are fabricated on the wafer. The functional cores can include one or more processors, AI accelerators, ASICS, peripheral interfaces, and so on. The functional cores can include memory. Other memory elements, such as SRAM, can be included in the monolithic wafer. The memory elements can also be fabricated on the wafer. Interconnect can be included on the monolithic wafer to couple any number of the functional cores, memory elements, and so on. The interconnect can comprise any number of metal layers on the wafer.

The flow 100 includes connecting mechanically 120 a plurality of modular power substrates (MPSs) to a unified control board (UCB). The connecting mechanically can be accomplished using plug-and-socket connectors, terminals, pins, clips, cables, and so on. In a usage example, the connecting mechanically an MPS to a control circuit can be accomplished using a DC power connector and a plurality of rigid-flex strips. The connecting mechanically can be based on a high-power socket, a high voltage socket, etc. The UCB can include one or more control circuits. The control circuits can include digital control circuits such as a processor, a multiprocessor, a microcontroller, and so on. The control circuits can control the plurality of MPSs (explained below). In the flow 100, the UCB includes a plurality of DC-to-DC power converters 122. The DC-to-DC power converters can convert DC power from a high voltage range to a low voltage range (e.g., buck conversion). In a usage example, the DC-to-DC converters can convert DC power from a high voltage range, such as 48 volts to 54 volts, to a lower voltage range, such as 12 volts to 13.5 volts. The higher voltage range can be a voltage range normally supplied to racks within a data center. In embodiments, the UCB comprises a printed circuit board (PCB). The UCB can include one or more materials. The materials associated with the UCB can include inorganic substrate materials, organic substrate materials, and so on. The organic substrate materials can include paper cores impregnated with phenolic resin; woven or unwoven glass cloth impregnated with epoxy or cyanate ester among others; natural fibers; FR-4; FR-5; etc. In a further usage example, one or more MPSs within the plurality of MPSs can include an inorganic substrate. The inorganic substrate materials can be based on a silicon glass. In embodiments, the PCB comprises ceramic. The ceramic associated with the PCB can include a coefficient of thermal expansion (CTE) similar to the WSSI or other components. Similar CTEs can help to limit differences in lateral movement between layers due to heat during operation. For example, Aluminum Nitride can have a CTE that is close to silicon. In embodiments, the PCB comprises Aluminum Nitride. A PCB can perform well in circuit applications where the circuits require high current and generate substantial heat.

The flow 100 includes attaching 130, to the back side of the WSSI, a plurality of modular power substrates (MPSs). The MPS can include power elements such as DC-to-DC converters, connectors such as high-power connectors, further connectors such as rigid-flex strips, and so on. The DC-to-DC converters associated with the MPSs can provide power to functional chips. In embodiments, each DC-to-DC converter in the plurality of DC-to-DC power converters is coupled to one or more functional chips in the plurality of functional chips. The MPSs can receive DC power, where the DC power can be sent by a control board such as a unified control board (discussed below). The DC power that is received by the plurality of MPSs can be transferred to the plurality of functional chips. The transferring can be based on a voltage conversion such as a DC voltage conversion. In the flow 100, the attaching is based on a plurality of compression connectors 132 (discussed below). The attaching is based on a compression force from the UCB. A force can be applied to the UCB in order to compress the compression connectors. The force can be accomplished by one or more of a spring, a clamp, and so on. In embodiments, the UCB comprises a compression plate. The compression plate can be deposited on the UCB, attached to the UCB, etc.

The compression connectors can be compressed in order to enable an electrical connection between the MPSs and the back side of the WSSI. Various types of compression connectors can be used. In embodiments, the plurality of compression connectors includes a plurality of spring-loaded pins. The spring-loaded pins can, when compressed, push back against a pin, a pad, a contact, and so on to enable an electrical connection. In embodiments, the plurality of compression connectors includes a plurality of wire nest contacts. A wire nest contact can include a braid of wire that forms a contact to a pad or other contact when compressed. In embodiments, the plurality of compression connectors includes a plurality of elastomers with embedded balls. When compressed, the embedded balls form an electrical connection between two contacts. The elastomer can support lateral displacement associated with different coefficients of thermal expansion associated with the MPSs and the WSSI. In other embodiments, the plurality of compression connectors includes a plurality of cantilever contacts. An electrical connection is formed when the cantilever is compressed.

In embodiments, each MPS within the plurality of MPSs is based on a form factor mirroring one or more corresponding functional chips within the plurality of functional chips on the front side of the WSSI. The form factor can be based on or more parameters associated with the one or more corresponding functional chips. In a usage example, the form factor can be based on a coefficient of thermal expansion (CTE). The functional chips can generate copious heat while operating. Physical components such as substrates, WSSIs, etc. can expand when heated based on a coefficient of thermal expansion associated with each material. A coefficient of thermal expansion of the UCB can be different than a coefficient of thermal expansion of the WSSI. The difference in expansion coefficients can cause connectors to disconnect, C4s to crack, physical strain within materials that can cause damage, etc. Thus, if the UCB is directly mechanically connected to a WSSI, the lateral displacement due to differences in thermal expansion can cause mechanical failure. Choosing an appropriate form factor for the MPSs can reduce risks of cracking and fracturing the WSSI due to differing CTEs associated with the functional chips bonded to the front side WSSI and the MPSs attached to the back side of the WSSI. Further, the modularity of the MPSs can provide a flexible power delivery system to the functional chips which can accommodate different movements of the WSSI and UCB due to thermal expansion. For example, an MPS at one side of the WSSI can be decoupled from an MPS on the other side of the WSSI, thus accommodating various movements across the WSSI and UCB. Further, the use of compliant connectors and rigid-flex strips (explained below) between the MPSs and the UCB can be used to better tolerate lateral displacement caused by CTE differences. By attaching the plurality of MPSs to the back side of the WSSI instead of the front side of the WSSI, heat mitigation techniques can be applied to the front side of the WSSI.

In the flow 100, the attaching couples 134 each MPS to one or more functional chips within the plurality of functional chips. The coupling each MPS to one or more functional chips can be accomplished using the plurality of through-silicon vias (discussed above), interconnect fabricated in one or more conducting layers fabricated on the WSSI, and so on. The conducting layers of interconnect are separated by insulating layers. In a usage example, the WSSI can include ten layers of interconnect where each layer is isolated from the other layers by insulating material. The conducting layers and the insulating layers can be fabricated on the back side of the WSSI, the front side of the WSSI, and both sides of the WSSI.

The flow 100 includes creating a plurality of grooves 136 on the back side of the WSSI. The grooves can be created using techniques such as grinding, laser etching, chemical etching, and so on. The grooves can be used for alignment, orientation, and the like. In the flow 100, each MPS in the plurality of MPSs includes an extension 138. The extension associated with each MPS can be fabricated on the MPS, attached to the MPS, etc. The fabrication of an extension on an MPS can be accomplished using a deposition technique. The attaching an extension on an MPS can be accomplished using a gluing technique. In the flow 100, the extension included within each MPS is inserted 140 in a groove in the plurality of grooves. The grooves, as discussed previously, can align the MPSs with the WSSI in order to optimize connections between the MPSs and the WSSI using the compression connectors. The extensions and grooves can also maintain connections under lateral displacements of the MPSs and the WSSI, where the lateral displacements can be associated with coefficients of thermal expansion (CTEs) of the WSSI and the MPSs.

In the flow 100, the attaching further comprises coupling 150 each MPS in the plurality of MPSs to a corresponding functional chip within the plurality of functional chips. The coupling each MPS to a corresponding functional chip can be accomplished using interconnect associated with the WSSI. In embodiments, the coupling can be accomplished using the plurality of through silicon vias (TSVs) associated with the WSSI. In embodiments, the plurality of MPSs is based on a form factor mirroring the corresponding functional chip. Recall that the MPSs can be based on a form factor. In embodiments, each MPS within the plurality of MPSs is based on a form factor mirroring one or more corresponding functional chips, within the plurality of functional chips, on the front side of the WSSI.

The flow 100 includes sending DC power 160, by the UCB, to the plurality of functional chips, wherein the sending is based on the plurality of DC-to-DC power converters, the plurality of MPSs, and the plurality of TSVs. Recall that the plurality of functional chips is bonded to the front side of the WSSI. The sending power can be further based on converting one or more DC voltages. In the flow 100, the sending includes delivering the DC power 170, by the UCB, to the plurality of MPSs, wherein the delivering includes a first voltage conversion. In a usage example, the first voltage conversion can include converting a voltage in a range such as 48 volts to 54 volts to a voltage in a lower range such as 12 volts to 13.5 volts. The first voltage conversion can be controlled by the control circuits included on the UCB. The flow 100 includes transferring the DC power 180 that was delivered, by the plurality of MPSs, to the plurality of functional chips, wherein the transferring includes a second voltage conversion. The second voltage conversion can convert a voltage to a voltage below a threshold. The second voltage conversion can change the voltage that the functional chips receive to an appropriate operating level, such as less than 1 volt. The transferring can be based on a plurality of MPSs that can be bonded to the back side of the WSSI. The second voltage conversion can be controlled by the control circuits included on the UCB. Chips such as the functional chips can be positioned such that connections to the chips align with the TSVs. In some examples, a wafer can be ground to enable TSV processing with repeatable shapes and parasitic characteristics.

The WSSI can be brought in contact with a cold plate. The cold plate contacts the plurality of functional chips bonded to the front side of the WSSI. The cold plate can be used to remove at least a portion of the heat generated by the functional chips while the chips are operating. The mounting the WSSI to the cold plate can be based on one or more spring-loaded fasteners. Thus, the WSSI can be held between the cold plate and the place where the WSSI contacts the compression connectors between the MPSs. The holding can apply pressure on the WSSI from the top and the bottom, stiffening the WSSI and maintaining coplanarity. The stiffening can be based on a reinforcement ring on each MPS within the plurality of MPSs. The plurality of stiffening reinforcement rings can be particularly critical because the WSSI can be thin. The WSSI, especially when ground or polished to accommodate TSVs, can be fragile. The reinforcement rings can thus provide support for the WSSI by enhancing stability, increasing stiffness, reducing the chance of cracking, enabling better electrical connections across the WSSI, etc. Thus, in embodiments, the reinforcement rings on each MPS within the plurality of MPSs maintains a coplanarity of each MPS in the plurality of MPSs.

In embodiments, the cold plate comprises an inlet plate, a jet-plate, and a fin-plate. The inlet plate can receive a liquid such as a liquid coolant. In embodiments, an inlet nozzle within the inlet plate is located orthogonally to a heat extraction plane within the fin-plate. The jet-plate can create a spray which can be sprayed onto the fin plate based on holes in the jet-plate. The holes in the jet-plate can include holes of substantially similar sizes or different sizes. The holes can concentrate a spray onto a region of the fin-plate covering the functional chips. In a usage example, holes toward the center of the jet-plate can be smaller than the holes toward the outer edges of the jet-plate to account for liquid pressure differences across the jet-plate. The fin-plate can include a plurality of internal fins onto which the jet-plate sprays a liquid coolant. The fins can increase the surface area of the fin-plate, thereby enhancing removal of heat from the functional chips to which the fin-plate is attached.

The cold plate provides liquid cooling for the plurality of functional chips. The liquid can include a coolant where the coolant can be distilled water or another liquid. The coolant can be mixed with additives such as glycol. The attaching the cold plate can include a thermal interface material (TIM). The TIM can conduct heat between surfaces, thus enabling more efficient cooling solutions. The TIM can comprise thermal tape, grease, gel, adhesive, phase change materials (PCMs), metal TIMs, pyrolytic graphite, and so on. In a usage example, the TIM can include an uncured TIM. The uncured TIM can remain flexible or viscous, thereby enabling the cold plate and the functional chips to expand by different lateral displacements based on different coefficients of thermal expansion.

Various steps in the flow 100 may be changed in order, repeated, omitted, or the like without departing from the disclosed concepts. Various embodiments of the flow 100 can be included in a computer program product embodied in a non-transitory computer readable medium that includes code executable by one or more processors.

Figure 2:
FIG. 2 is a flow diagram for stiffening a modular power substrate.
Figure 2:
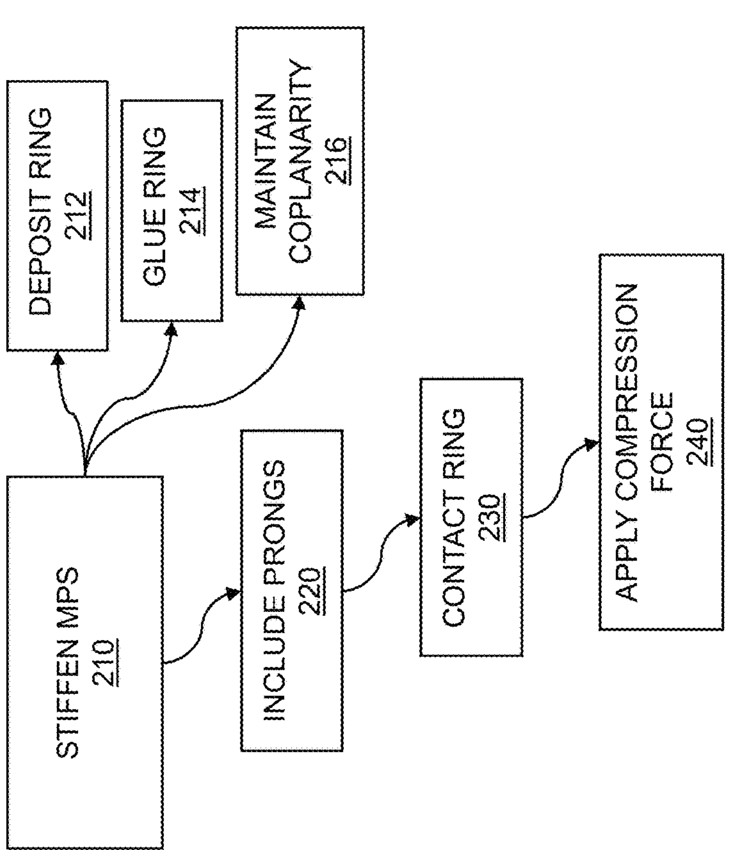

FIG. 2 is a flow diagram for stiffening a modular power substrate. Discussed previously and throughout, wafer-scale integration can be accomplished using a wafer-scale interposer. A top side of the interposer can be bonded to a plurality of functional chips, where the functional chips can include processors, multiprocessors, artificial intelligence accelerators, machine learning accelerators, and so on. The functional chips must be provided power such as DC power in order for the functional chips to operate. Power to the functional chips can be provided by mechanically connecting a plurality of modular power substates (MPSs) to a unified control board (UCB). The UCB can include DC-to-DC converters that can convert a DC voltage to a first DC voltage. The MPSs can further include DC-to-DC converters that can convert the first DC voltage to a second DC voltage. By attaching the plurality of MPSs to a back side of the wafer-scale interposer, the DC power can be provided by the MPSs on the back side of the interposer to the front side of the interposer using through-silicon vias (TSVs).

Chips such as functional chips can be bonded to a wafer-scale silicon interposer (WSSI). The use of the WSSI supports wafer-scale integration (WSI), which is particularly useful to supporting the processing requirements of computationally intensive applications such as artificial intelligence (AI) acceleration. The functional chips that execute the computationally intensive applications require significant amounts of power during operation. The power, which includes DC power, must be sent or transferred to the functional chips. The power can be provided using modular power delivery techniques. A WSSI can be brittle and difficult to handle, especially with a plurality of functional chips bonded to a front side. Further, the coplanarity of the WSSI can vary, resulting in less-than-optimal electrical connections across the front side and back side of the WSSI. Even further, in support of reliably manufacturing the TSVs, the interposer can be ground and/or polished to a thinness that can support fabrication of the TSV. This can thin the wafer, making it more difficult to handle without cracking, especially with the additional weight of front side functional chips. Thus, the MPSs must be supported or stiffened in order to protect the wafer-scale silicon interposer from cracking or fracturing. The MPSs can be stiffened using a reinforcement ring on each MPS as described above. The reinforcement ring on each MPS within the plurality of MPSs maintains a coplanarity of each MPS in the plurality of MPSs. The reinforcement rings can also reduce the risk of cracking and fracturing of the WSSI during handling, assembly, functional operation, and so on. The stiffening the MPSs enables back side power delivery for wafer-scale integration with solderless modular power substrates.

The flow 200 includes stiffening 210 each MPS in the plurality of MPSs. The stiffening can be accomplished using a frame, a support, a ring, and so on. The stiffening can be used to improve connections such as compression connections between each MPS and a wafer-scale silicon interposer (WSSI). The compression connections can be accomplished using compression connectors. As described throughout, the compression connectors can include wire nest contacts, elastomers with embedded balls, cantilever contacts, and the like. In embodiments, the stiffening is based on a reinforcement ring on each MPS within the plurality of MPSs. The reinforcement ring can be fabricated on each MPS, mounted on each MPS, bonded to each MPS, and so on. The flow 200 includes depositing 212, on each MPS within the plurality of MPSs, the reinforcement ring. Various deposition techniques can be used to form the reinforcement ring. In a usage example, the deposition technique can include chemical vapor deposition (CVD). The flow 200 further includes gluing 214, to each MPS within the plurality of MPSs, the reinforcement ring. The gluing can be accomplished using an epoxy, cyanoacrylate, and the like. The reinforcement ring can introduce other advantages to stiffening each MPS. In the flow 200, the reinforcement ring on each MPS within the plurality of MPSs maintains a coplanarity 216 of each MPS in the plurality of MPSs. Coplanarity can improve reliability of mechanical connections based on compression connectors.

The flow 200 can continue with including a plurality of compression prongs 220. The compression prongs can be used to transfer a force on a board such as a unified control board (UCB) to each MPS. In order to transfer the force, the compression prongs can be in contact with one or more key elements associated with each MPS. In the flow 200, the plurality of compression prongs contacts 230 the reinforcement ring on each MPS in the plurality of MPSs. By contacting the reinforcement ring with the compression prongs, a compression force can be distributed across each MPS, thereby minimizing warping, deflection, displacement, etc. of each MPS. Recall that the plurality of MPSs can be attached to a back side of the WSSI based on a plurality of compression connectors. In the flow 200, the attaching includes applying a compression force 240 to the UCB. The compression force is delivered to the plurality of compression connectors by the compression prongs. Described above, in embodiments, the plurality of compression connectors includes a plurality of spring-loaded pins. The spring-loaded pins can press back against the compression force, thereby enabling a reliable electrical connection between each MPS and the WSSI. In embodiments, the plurality of compression connectors includes a plurality of wire nest contacts. A wire nest contact can include a braid of wire that forms a contact to a pad or other contact when the wire nest is compressed. In embodiments, the plurality of compression connectors includes a plurality of elastomers with embedded balls. The embedded balls within the elastomers enable compression connections between the MPSs and the WSSI. Further, the elastomers can enable a lateral deflection of the MPSs and the WSSI due to differing coefficients of thermal expansion associated with the MPSs and the WSSI. The elastomers can include an elastomer sheet, such as an anisotropic conductive film (ACF). In other embodiments, the plurality of compression connectors includes a plurality of cantilever contacts. The cantilever contacts can apply back pressure to the compression connectors between the MPSs and the WSSI.

Power is sent by the unified control board (UCB) to the plurality of functional chips bonded to the front side of the WSSI via the stiffened MPSs. The sending DC power can be accomplished using an interposer associated with a wafer-scale silicon interposer (WSSI). The WSSI can include layers of interconnect fabricated on a front side and a back side of the WSSI. The interconnect can include vias such as through-silicon vias (TSVs). The TSVs can provide connections directly between the front side of the WSSI and the back side of the WSSI. In embodiments, the sending DC power is based on the plurality of MPSs and the plurality of TSVs. The sending can include delivering the DC power, by UCB, to the plurality of MPSs. The delivering can be accomplished using the TSVs, WSSI interconnect, and so on. The delivering DC power can be accomplished by the plurality of DC-to-DC converters included on the UCB. The delivering DC power can include delivering DC power to a subset of MPSs. The delivering DC power can be accomplished by matching one or more DC-to-DC converters to one or more MPSs. Interconnection between the DC-to-DC converters matched with one or more respective MPSs can be accomplished using interconnect associated with the UCB. The sending can be based on a DC voltage.

The DC power that is delivered can include a range for the DC voltage. The range of DC voltage can include a percentage of a target voltage, an allowable operating range of DC voltage, and the like. In a usage example, the voltage range can include 48 volts to 54 volts, inclusive. The delivering can include a first voltage conversion. The first voltage conversion can include a DC-to-DC voltage conversion. The result of the DC-to-DC voltage conversion can include a DC voltage higher than the input DC voltage or a DC voltage lower than the input DC voltage. The first voltage conversion can be accomplished using the one or more DC-to-DC converters. The DC-to-DC converters can include a plurality of DC-to-DC converters connected to the UCB.

The DC power that was delivered, by the plurality of MPSs, can be transferred to the plurality of functional chips. The one or more functional chips can obtain the transferred power using interconnect, contacts, vias, and so on. The functional chips can also use interconnect and contacts to receive and send data, instructions, control signals, etc. The transferring can include a second voltage conversion. The second voltage conversion can be accomplished using one or more converters such as DC-to-DC converters associated with the MPSs. The second voltage conversion can produce a voltage that can be used directly to operate one or more functional chips. The second voltage conversion can attain a voltage less than the voltage resulting from the first voltage conversion. The second voltage conversion can result in a voltage less than a threshold. The threshold can include a target voltage, an operating voltage, and so on. In a usage example, the threshold is 1 volt. In a usage example, the transferring can be based on the plurality of TSVs. The transferring can include transferring DC power, receiving and sending data, sending and receiving functional chip instructions and control signals, etc.

Various steps in the flow 200 may be changed in order, repeated, omitted, or the like without departing from the disclosed concepts. Various embodiments of the flow 200 can be included in a computer program product embodied in a non-transitory computer readable medium that includes code executable by one or more processors.

Figure 3:
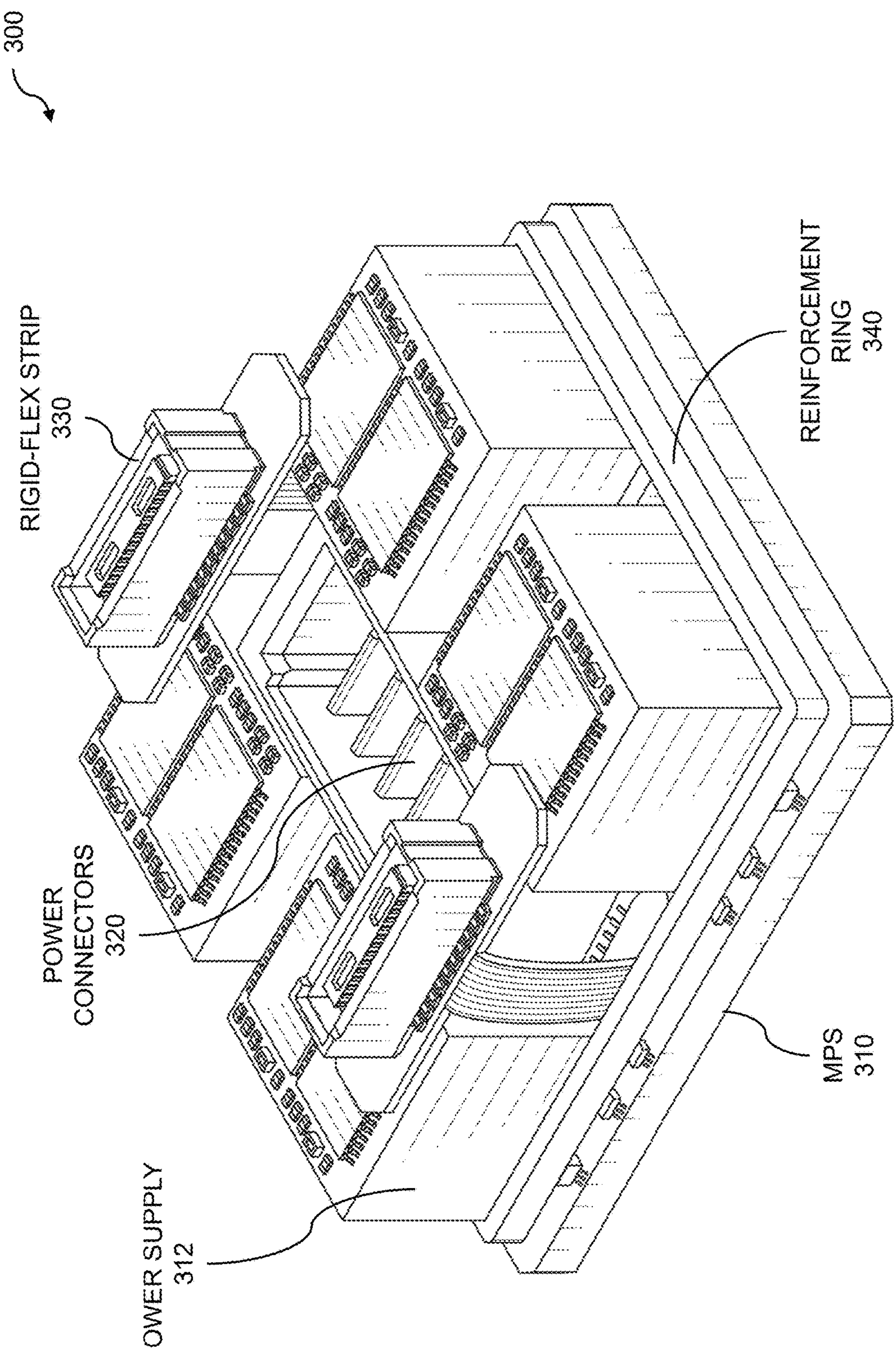
FIG. 3 is an illustration of a modular power substrate with a reinforcement ring.

FIG. 3 is an illustration of a modular power substrate with a reinforcement ring. Integrated circuits or "chips" such as processor circuits require power in order to operate. When a significant number of circuits is obtained to achieve an objective such as a processing objective, the power requirements for the many circuits become substantial, and the requirements for providing the power become more stringent. The power requirements become more stringent because the aggregate power delivery to the chips can include tens, hundreds, or more amperes. Further, the many circuits to which the power is provided to generate copious heat. The heat generated by the various elements of a system such as power supplies, functional chips, and so on causes the elements to expand. Since the elements comprise different materials, coefficients of expansion of the elements can differ. To counter the potentially disastrous effects such as breakage resulting from differing coefficients of expansion, power supplies that can be used to power one or more functional chips can be arranged on one or more modular power substrates (MPS). The MPSs can enable lateral displacement between other elements that expand and contract, minimizing potential material strain. Recall that a unified control board (USB) to which the MPSs can be mechanically connected can be used to enhance the attaching of the MPSs to a back side of a wafer-scale silicon interposer (WSSI). The attaching is based on a plurality of compression connectors. However, since the UCB and the MPSs can flex under compression, the MPSs can be stiffened based on a reinforcement ring on each MPS within the plurality of MPSs. The reinforcement ring enables back side delivery for wafer-scale integration with solderless modular power substrates.

A wafer-scale silicon interposer (WSSI) is accessed. A front side of the WSSI is bonded to a plurality of functional chips. The WSSI includes a plurality of through-silicon vias (TSVs). A plurality of modular power substrates (MPSs) is connected mechanically to a unified control board (UCB). The UCB includes a plurality of DC-to-DC power converters. The plurality of MPSs is attached to a back side of the WSSI. The attaching is based on a plurality of compression connectors. The attaching is based on a compression force from the UCB. The attaching couples each MPS to one or more functional chips within the plurality of functional chips. DC power is sent by the UCB to the plurality of functional chips. The sending is based on the plurality of DC-to-DC power converters, the plurality of MPSs, and the plurality of TSVs.

The illustration 300 shows a modular power substrate (MPS) with a reinforcement ring. Elements such as one or more power supplies, connectors, rigid-flex strips, etc. can be mounted to an MPS 310. The number of elements that can be attached to the MPS can be based on the size, shape, and so on of the MPS. A plurality of MPSs can be used to deliver power to a plurality of functional chips. The MPS can be based on a variety of substrate materials. In a usage example, one or more MPSs within the plurality of MPSs can include an organic substrate. An organic substrate can be based on one or more organic materials such as organic materials used to manufacture printed circuit boards. The organic substrate materials can include paper cores impregnated with phenolic resin; woven or unwoven glass cloth impregnated with epoxy or cyanate ester among others; natural fibers; etc. In a further usage example, one or more MPSs within the plurality of MPSs can include an inorganic substrate. An inorganic substrate can be based on a silicon glass with a coefficient of expansion similar to the WSSI, etc.

An MPS can include a form factor. Recall that a plurality of functional chips can be bonded to a front side of a wafer-scale silicon interposer (WSSI). A plurality of MPSs can be based on a form factor mirroring one or more corresponding functional chips, within the plurality of functional chips, on the front side of the WSSI. The plurality of MPSs is coupled to the plurality of functional chips. The MPSs can be mechanically connected to a unified control board (UCB) and can also be attached to a back side of the WSSI. Thus, the MPSs can be situated between the UCB and the WSSI. As described above, the WSSI and the UCB can have different coefficients of thermal expansion leading to different lateral movements. These lateral movements can be sufficient to crack connections and/or introduce warpage into components which can lead to connection failures such as disconnected connectors, cracked C4s, damage due to physical strain, etc. The modularity of the MPSs can provide a flexible power delivery system to the functional chips which can accommodate different movements of the WSSI and UCB due to thermal expansion. For example, an MPS at one side of the WSSI can be decoupled from an MPS on the other side of the WSSI, thus accommodating various movements across the WSSI and UCB.

A power supply 312 can be coupled to the MPS. In the figure, three additional power supplies are shown attached to the MPS. The number of power supplies attached to the MPS can be based on the dimensions of the MPS, the dimensions of the power supplies, a voltage or current required by the functional chips, coefficients of expansion, heat dissipation, etc. The MPS can include one or more power connectors 320. The power connectors can fit with a high voltage socket, a high-power socket, etc. from the UCB. The power connectors can include one or more of positive terminals, negative terminals, common terminals, and so on. The high voltage socket can accommodate lateral movement due to thermal expansion. The MPS can include one or more rigid-flex strips 330. The one or more rigid-flex strips can be used to connect an MPS to the UCB. The connection can include control signals, power delivery, and so on. The rigid-flex strips can provide further protection from differing rates of thermal expansion between the WSSI and the UCB, through the use of a flexible connector.

The pressure to engage the compression connectors at the bottom of the WSSI can be delivered by the MPS as the UCB pushes the MPSs into the back side of the WSSI via the power connector 320. The power connector can be located in the middle of the MPS, as shown in illustration 300. However, the MPS may not be completely planar, and the force applied at the middle of the MPS may not be enough to fully engage the compression connectors throughout the underside of the MPSs. To maintain planarity of the MPSs and to provide uniform compression force to engage the compression connectors at the back side of the WSSI, stiffening techniques can be applied. Embodiments include stiffening each MPS in the plurality of MPSs. The stiffening is based on a reinforcement ring 340 on each MPS within the plurality of MPSs. The reinforcement ring can enable a compression force applied by a unified control board (UCB) to be distributed across each MPS. The compression force can then be transferred from each MPS to compression connectors that enable connection between the MPSs and the WSSI. The reinforcement ring can be attached to each MPS, fabricated on each MPS, and so on. Embodiments include depositing, on each MPS within the plurality of MPSs, the reinforcement ring. The depositing can be accomplished using techniques such as chemical vapor deposition techniques. Further embodiments include gluing, to each MPS within the plurality of MPSs, the reinforcement ring. The gluing can be accomplished using an epoxy, an ethyl cyanoacrylate, and so on. Noted above, a reinforcement ring associated with each MPS can enable transfer of a compression force to the plurality of compression connectors. In embodiments, the reinforcement ring on each MPS within the plurality of MPSs maintains a coplanarity of each MPS in the plurality of MPSs.

Figure 4:
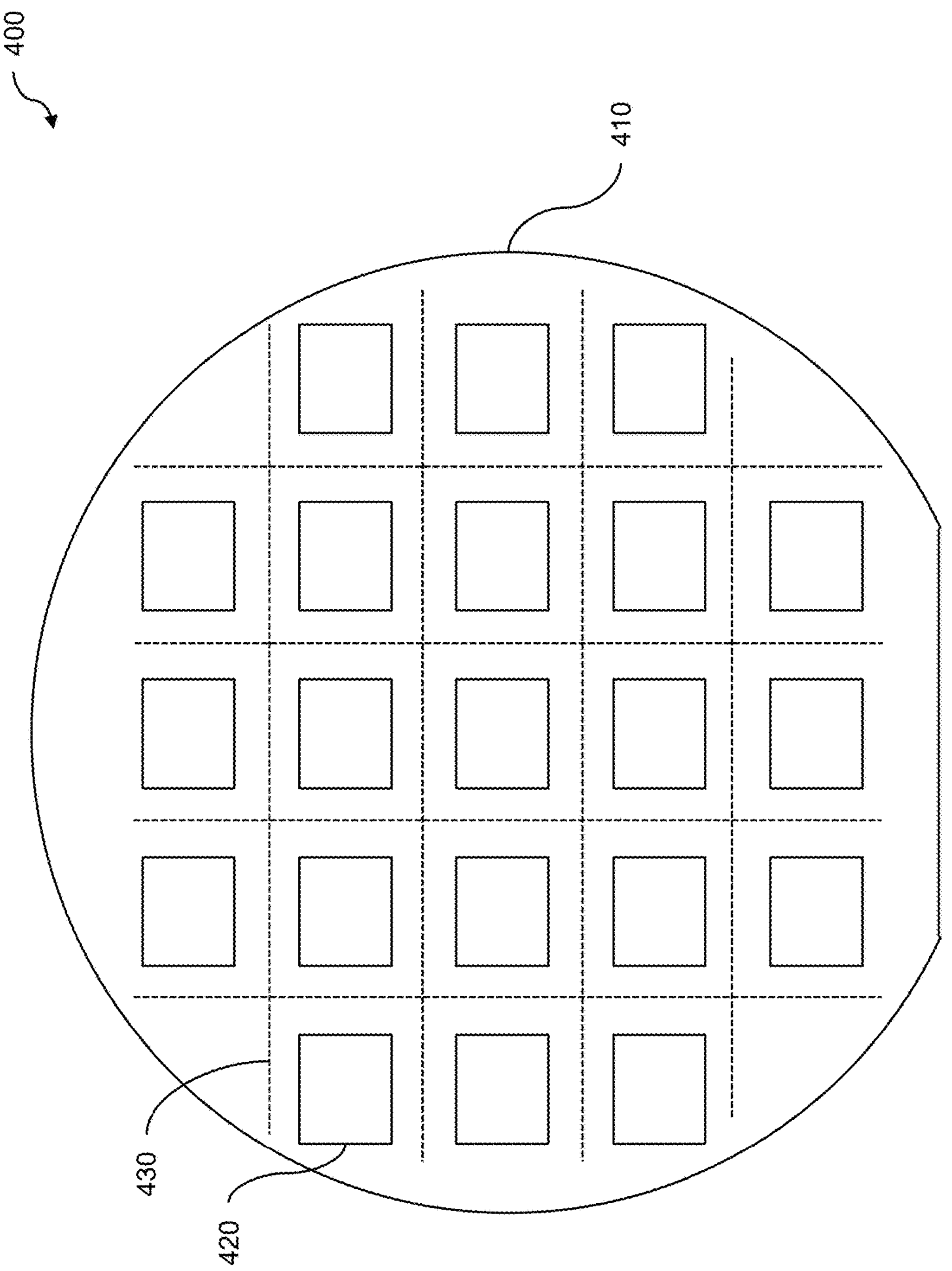
FIG. 4 shows a wafer with multiple die.

FIG. 4 shows a wafer with multiple die. A semiconductor wafer such as a silicon wafer is used in the fabrication of electronic circuits. Other semiconductor materials such as germanium, silicon carbide, indium phosphide, etc. can also be used. The wafers that are used are obtained in various sizes. One common wafer size includes a 300 mm silicon wafer. Integrated circuits or "chips" can be fabricated on the surface of the wafer by applying, removing, etc. various layers. The layers are applied to the wafer using techniques that can include diffusion, deposition, etching, planarization, and so on. The numbers of layers applied to the wafer can include dozens of layers, hundreds of layers, and so on. The layers can include active areas, polysilicon, metal, contacts, vias, and so on. The circuits are called "die" during fabrication. The die can include a plurality of similar circuits or can include two or more different circuits or "projects". The similar circuits and the different projects can include processors, memories, mixed-signal chips, and so on. The multiple die that can be fabricated on the semiconductor wafer can include accelerators for arterial intelligence and machine learning. The multiple die can be used to enable back side power delivery for wafer-scale integration with solderless modular power substrates. Reinforcements rings can be used to stiffen elements such as modular power supplies (MPSs). The reinforcement rings can be glued, deposited, or otherwise applied to each MPS. The reinforcement ring on each MPS within the plurality of MPSs maintains a coplanarity of each MPS in the plurality of MPSs.

The FIG. 400 shows a wafer with multiple die. A wafer can be based on a monocrystalline semiconductor material. The semiconductor material can include a group IV material such as silicon, a group III-V material such as gallium arsenide, and so on. The die on the wafer shown are substantially similar in size. However, the die can be substantially different in size. A system can depend on a certain number of functional die. For instance, an artificial accelerator used for training a large language model (LLM) to be executed on a neural network (NN) can require a large number of functional die. The die can be AI accelerators, ML accelerators, and so on. Since a wafer will contain defects randomly distributed across the wafer, some of the die fabricated on the wafer will be affected by the wafer defects and will not function properly. By fabricating multiples of the die, the probability of fabricating at least one functioning chip increases. Further, because the presence or absence of circuits or die on the wafer can influence successful fabrication of a given die, a wafer can be "covered" with circuits for fabrication. Because of the shape of the wafer, which is typically round with at least one flat edge to aid alignment, some of the circuits may not be fully contained within the boundaries of the wafer. The resulting "partial" circuits or die will not function fully or at all. In some cases, the partial die may be usable in other applications.

A wafer is shown 410. The wafer can include multiple die such as die 420. The multiple die can be replicas of the same chip. In some cases, the multiple die can be different die, such as SRAM die. The die on the wafer can all be fabricated using the same fabrication technology. If any die requires different fabrication technologies, then that die must be fabricated on a different wafer. While 21 die are shown on wafer 410, in practice any number of die can be present. The number of die will depend on the size of the wafer and the size of the die. When fabrication steps, of which there can be many, are completed, the die can be separated. The figure shows a plurality of dashed lines such as line 430. The dashed lines represent scribe lines or kerf associated with the wafer. A saw, a laser, etc. is used to slice the wafer into liberated, individual die. Since the saw or other cutting device has a finite width, some wafer material is lost due to the width of the saw or cutting device. As a result, any structures such as test structures used to track processing steps during fabrication are lost.

While multiple die are shown in the diagram, the desire to further push the size of individual die has continued at a rapid pace. As one reference point, a packaged processor chip that is larger than 35 mm on a side has become common. However, as die on a wafer become larger, the risk of individual die being impacted by defects in the wafer or defects associated with any of the many fabrication steps increases. How, then, could one produce even larger chips? One suggestion that has long been proposed is to use the "entire" wafer to form a single large chip or "super chip". In addition to producing the one chip on the wafer, packaging could potentially be reduced since the packaging would involve the one chip instead of a typical suite of chips, where each chip requires its own packaging. Wafer scale integration or WSI has been proposed as particularly well suited to applications that demand extensive data processing. Examples proposed that could benefit from WSI have included computer architectures appropriate for massively parallel supercomputers, and computationally intensive applications such as machine learning and deep learning. However, successful fabrication of a single chip across an entire wafer is an extremely difficult undertaking. Noted above, the widespread and random distribution of defects and other variations such as warpage across a wafer render the ability to build one "super-circuit" elusive. Also, circuit redundancy becomes a major design issue. Not only are redundant circuits that can be switched in to replace defective circuits necessary, but the locations of the redundant circuits are also critical. Note that the redundant circuits must be connected in place of the defective circuits, and that wiring on an integrated circuit is extremely expensive in terms of real estate. As a result, the placement of the redundant circuits must be carefully considered to conserve wafer real estate and to reduce wiring complexity.

Figure 5:
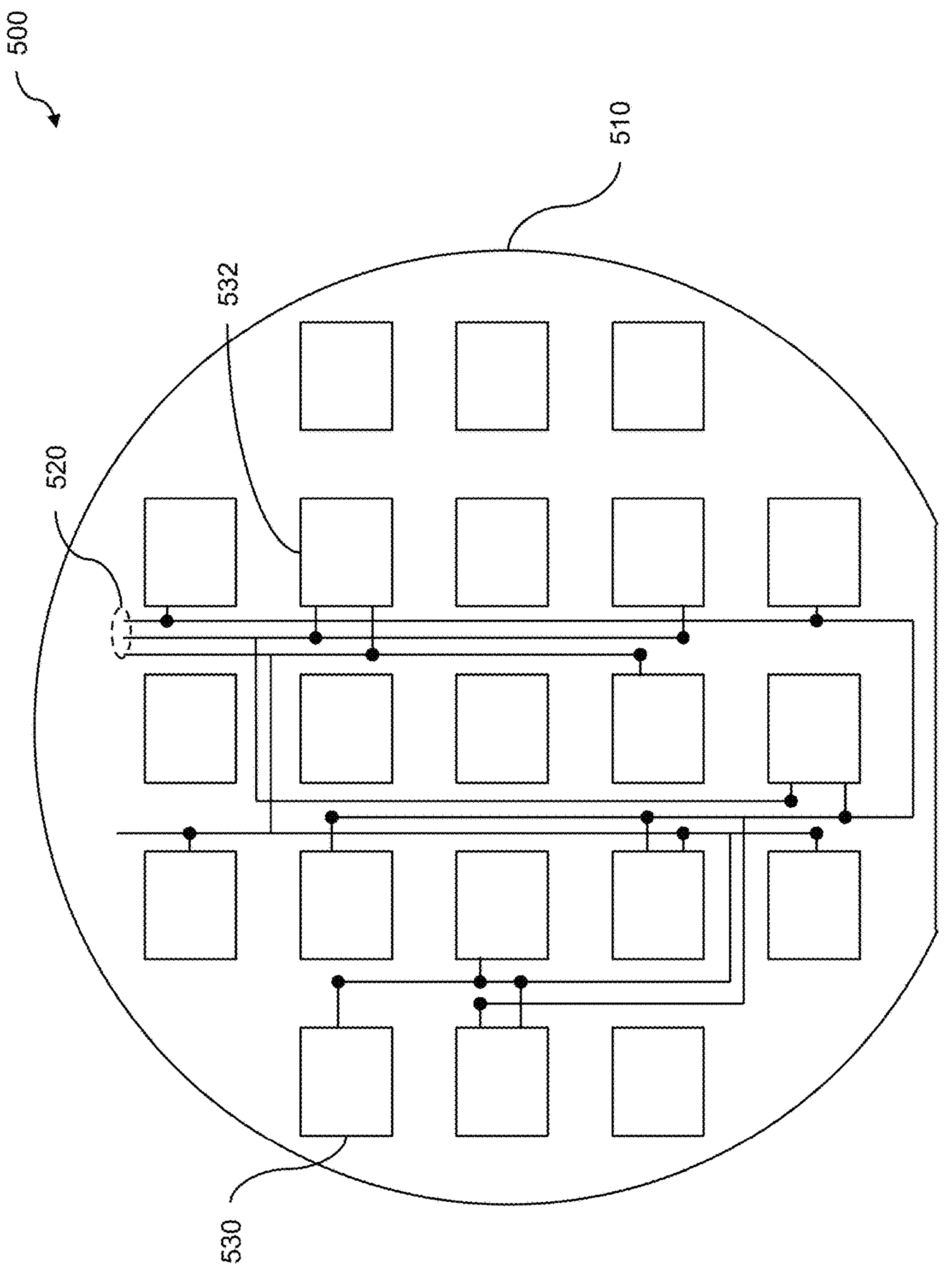
FIG. 5 illustrates inter-die interconnect for wafer-scale integration.

FIG. 5 illustrates inter-die interconnect for wafer-scale integration. Discussed previously and throughout, the demand for ever larger integrated circuits that can meet increasingly intensive processing demands has been stymied by the difficulty of producing large, single chips. One of the fundamental difficulties of producing a large chip, such as a wafer-sized chip, is that defects are randomly distributed across a wafer on which the large chip would be produced. Further, defects, such as disconnects in wiring, variations in oxide (insulator) thicknesses, open-circuit contacts, varying doping profiles, and so on, can be introduced during the fabrication process. One possible approach to "wafer-scale" integration is to continue to fabricate circuits on the wafer. Then, instead of cutting the wafer to access the individual dies, the wafer remains whole. By adopting an approach such as this one, the kerf, previously lost to the cutting of the wafer into the individual die, can be used for interconnect channels. Recall that interconnect on a wafer consumes wafer real estate that cannot otherwise be used for circuitry. By capturing the real estate previously lost to the kerf, additional wafer real estate that can be used for interconnect is captured. The interconnect in the kerf is particularly appropriate for long-haul connections, such as connections between individual die on the wafer. Since the wafer can be thinned during fabrication to enable vias, called through-silicon vias, to provide connections between a front side of the wafer and a back side of the wafer, the wafer can be reinforced. Back side power delivery for wafer-scale integration with solderless modular power substrates is enabled by inter-die interconnection.

The FIG. 500 illustrates use of wafer real estate, otherwise lost to scribe lines or kerf for inter-die interconnect, for wafer-scale integration. A wafer 510 is shown on which multiple die, or chips, are distributed. The die are fabricated together on the wafer. That is, each of the die on the wafer is fabricated based on the same processing steps. Since the individual die will not be separated from the wafer using a cutting technique, the kerf area of the wafer can be used for interconnect. Other areas of the die can also be used for interconnect. The interconnect 520 can be placed in wiring channels or routes, where the wiring channels are realized in what would formerly have been the kerf. The wiring channels include wafer real estate in which interconnecting wire can be placed. The interconnect can be fabricated while the various die on the wafer are fabricated. The interconnect can include a plurality of wiring layers. The various layers can be interconnected using contacts, vias, and so on. In the figure, a few example interconnecting runs are shown. The various die on the wafer can make connections to the wiring channels. In the figure, die 530 can use the wiring channels to connect to die 532.

Figure 6:
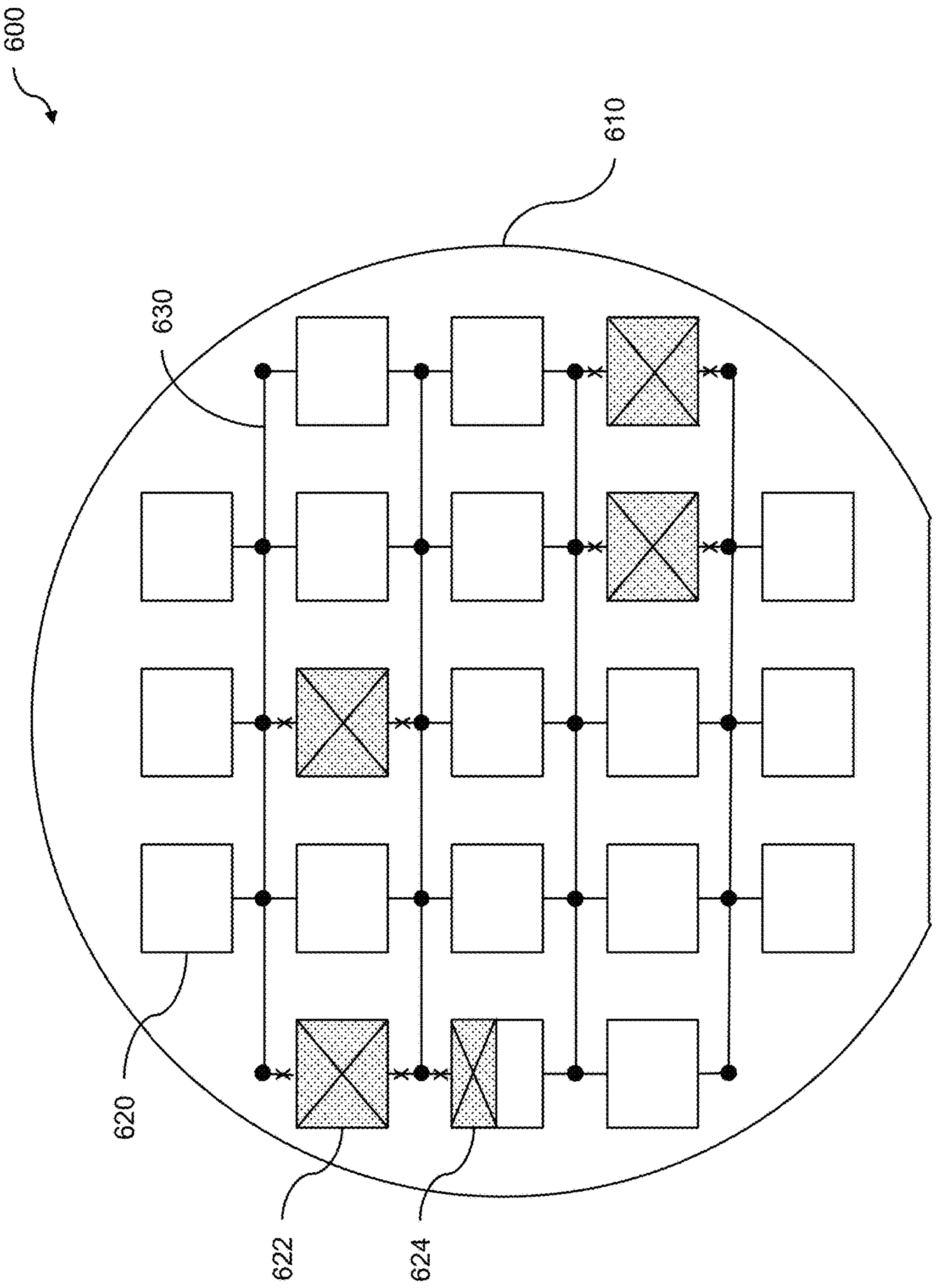
FIG. 6 shows inter-die interconnect and redundancy for wafer-scale integration.

FIG. 6 shows inter-die interconnect and redundancy for wafer-scale integration. Building on the previous discussions of techniques including fabricating redundant die on a wafer and of using the kerf for interconnect, a technique for wafer-scale integration (WSI) can be based on fabricating redundant die on the wafer, and selecting the working die for use by a system based on WSI. Working die can be selected while non-working die, partial die, and other substandard die can be electrically ejected from the system by deselecting the die. The deselecting can include disabling wired connections to the unused die, physically "blowing" connections to the unused die (e.g., a fuse), and so on. The remaining functioning die can be interconnected using inter-die interconnect to form a system on the wafer. The system on the wafer can achieve the desired objective of wafer-scale integration. Power, data, control signals, and so on can be provided to the selected, working die. Due to the size of the wafer on which the interconnected die are fabricated, the wafer can be subject to warping, cracking, breakage, and so on. The wafer can be supported or stiffened such that risks of damage to the wafer and the die on the wafer can be minimized. Further, connections between the wafer and elements such as power supplies, DC-to-DC converters, controllers, and so on can be established using compression connectors. Inter-die interconnect and redundancy to support back side power delivery for wafer-scale integration are enabled with solderless modular power substrates.

The FIG. 600 shows redundant die and inter-die interconnect. A wafer is shown 610. The wafer is populated with multiple die such as die 620. A number of the die shown can be redundant. Some of the redundant die will include defects, can be incomplete, can miss specifications, or can otherwise fail. The defects can be associated with the wafer on which the die are fabricated, associated with one or more processing steps for fabricating the die, and so on. This can result in die that are not operational, such as die 622. Recall that die can be fabricated on the wafer in order to ease some fabrication complexities, and that some of the added die can include partial die such as die 624. The failed die and the partial die can be excluded from a system formed by wafer-scale integration (WSI). In some cases, a die such as 624 can be partially functioning. The portion of the die that is functioning can be included in the WSI, while the portion of the die that is not functioning can be excluded. The functioning die can be inter-connected using inter-die interconnect 630. The inter-die interconnect can include multilayer interconnect. The inter-die interconnect can be placed between the die associated with the multiple projects. Functioning die can be connected to the inter-die interconnect, while non-functioning die can be disconnected from the inter-die inter-connect.

Figure 7:
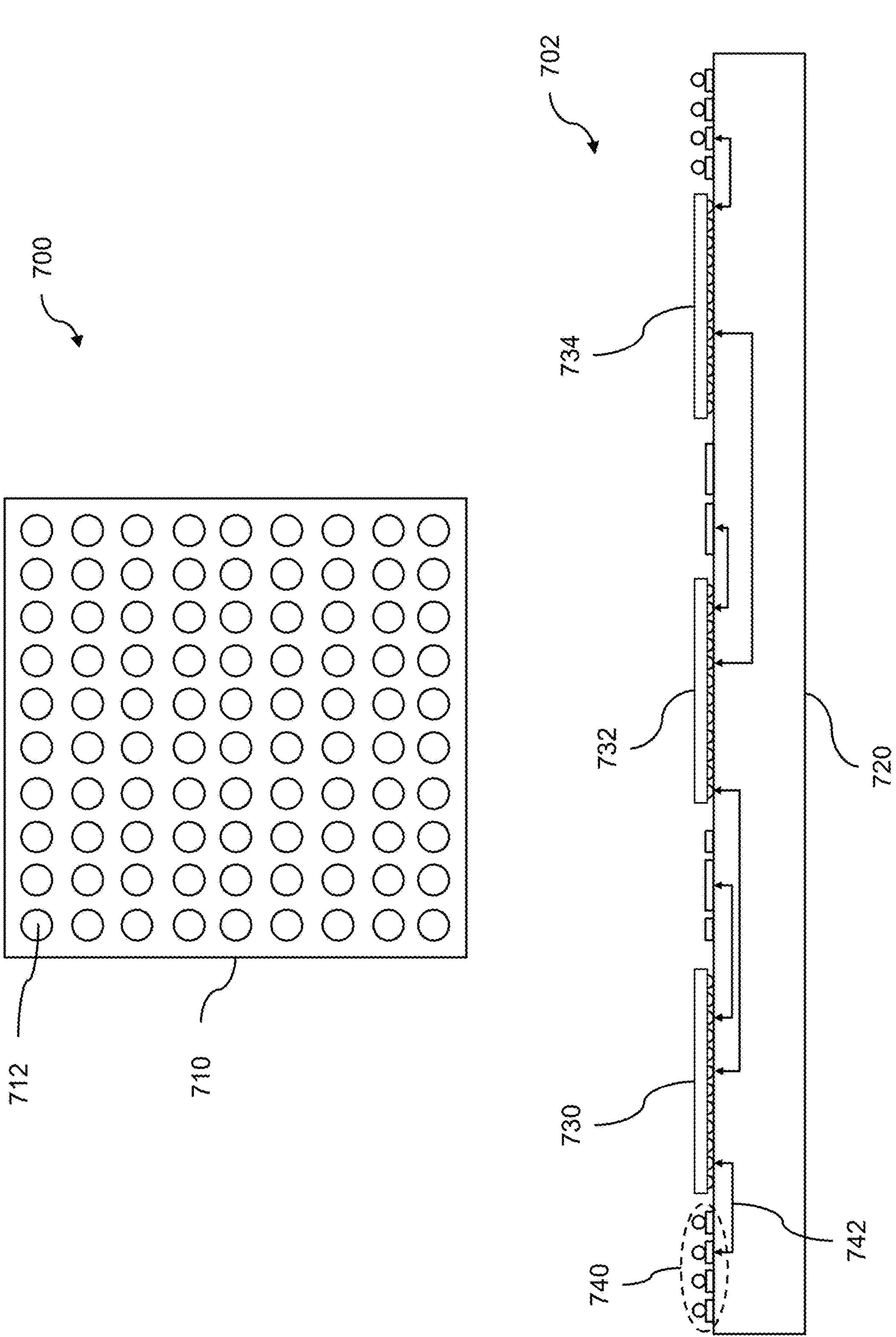
FIG. 7 illustrates a flip-chip and interposer with flip-chips for wafer-scale integration.

FIG. 7 illustrates a flip-chip and interposer with flip-chips for wafer-scale integration. One technique that can be used to approach the benefits of wafer-scale integration is to attach more than one chip to a common substrate or interposer. The substrate can include a wafer, a carrier, a circuit board, and so on. To accomplish such a technique, all interconnections to a circuit or chip, including data connections, control and signal connections, power connections, and so on, can be made at the top layer of the chip. The connections at the top of the chip replace the traditional placement of pads at the periphery of the chip. To connect the top connections of the chip to the interposer, solder balls are placed on the top connections and the chip is inverted or "flipped". The solder balls, when melted, can connect the top connections of the chip to corresponding connections or pads on the interposer. Further chips can be similarly flipped and connected to additional corresponding connections on the interposer. One challenge to the flip-chip technique is providing power to the chips. The power can be provided using back side power delivery based on modular power substrates (MPSs). A further challenge to the flip-chip technique is that the aggregate weight of the flipped chips can be sufficient to pose a risk to the delicate wafer or interposer. The wafer can be stiffened in order to protect it from the weight of the flipped chips. The stiffening can be accomplished by stiffening each MPS. The stiffening is based on a reinforcement ring on each MPS. The back-side power delivery for wafer-scale integration is enabled with solderless modular power substrates.

The FIG. 700 includes an example flip-chip. Discussed previously, the flip-chip 710 differs from a traditional chip in that the connections to the flip-chip are made at the top of the chip rather than to pads located at the periphery of the chip. A top view of a flip-chip is shown. The top can include pads that can be connected to corresponding pads on a multi-chip module, a circuit board, an interposer, and so on. An example contact or pad 712 is shown. Multiple pads can be distributed across the top of the flip-chip. The pads can be oriented to correspond with receiving pads on the interposer. An array of pads is shown. In a usage example, a subset of pads can be required to connect the flip-chip to the interposer. Thus, required pads are present at the top of the flip-chip, while the unused pads can be omitted from the top of the flip-chip.

The illustration 702 shows an example interposer. As discussed previously, the interposer 720 can include a wafer, a carrier, a circuit board, and so on. One or more flip-chips can be attached to the interposer. In the figure, the flip-chips can include a first flip-chip 730, a second flip-chip 732, a third flip-chip 734, and so on. While three flip-chips are shown, other numbers of flip-chips can be attached to the interposer. In a usage example, the flip-chips can be attached to the interposer in a grid pattern. In addition to serving as a placement location for the flip-chips, the interposer can provide interconnect. The interconnect can be used to provide signals such as control signals, data, and so on to the flip-chips. The interconnect can further provide power to the flip-chips. Depending on the interposer used to receive the flip-chips, the interposer can include one or more layers of interconnect. The interconnect can include interconnect at a top surface of the interposer such as top surface interconnect 740. The interposer can further include additional layers of interconnect. The additional layers of interconnect can be fabricated on the interposer. The additional layers of interconnect can be isolated from each other using an insulating layer between the conducting interconnect layers. An example "lower layer" connection 742 is shown.

The use of flip-chips attached to an interposer can enable multichip module (MCM) techniques. A multichip module can refer to a substrate, carrier, circuit board, interposer, etc. onto which multiple ICs can be placed. The multiple ICs can be attached to the interposer, and the multiple ICs can be wired together using interconnect provided by the interposer. The interconnect associated with the interposer can provide power, control signals, and data between and among the ICs that are attached to the interposer. The power can be provided using modular power techniques. Depending on the particular type of MCM, the interposer can further include discrete components such as discrete resistors, discrete capacitors, discrete inductors, discrete diodes, etc. The interposer further includes wiring for interconnecting ICs and the discrete components, if any. The MCM can be packaged and used as if it were a single IC on a board such as a circuit board within a system. MCMs have also been referenced as heterogeneous integration circuits and hybrid integrated circuits. A principal advantage of using MCMs is that multiple electronic components can be enclosed in a single "chip", thereby improving modularity of a system design. Also, the use of MCMs can improve IC yields over ICs produced using monolithic IC design methodologies.

There can be several varieties of MCMs, where the MCM varieties are typically differentiated by size, complexity, design methodology, and so on. At one end of the complexity scale, an MCM can include standard off-the-shelf ICs. The ICs can be attached to a circuit board such as a printed circuit board and can be used in place of an existing chip or package of chips. The printed circuit board can be designed to match the size and pin-out of the existing chip or package of chips. An MCM can also be a complex element. The complex MCM can be based on one or more fully customized IC packages. The fully customized IC packages can be used to integrate multiple IC dies (e.g., unpackaged ICs) onto a substrate that provides interconnection among the dies. Because of the wiring requirements of the multiple IC dies, the substrate typically includes high density interconnection (HDI). The substrates that are used for the MCM can include thin films for interconnects (wires) and dielectrics (insulators); thick films that enable more than one layer of interconnect and ceramic; and substrates that include laminates based on organics or plastics. The MCM based on thin films of interconnects and dielectrics can result in the highest circuit densities.

The MCM design concepts described previously suggest promising leads for implementing wafer-scale integration ICs. Multiple circuit dies could be fabricated within the same wafer. The wafer could further include built-in self-test (BIST), circuit redundancy to provide spare parts, and "self-rerouting". The self-rerouting can "reroute" around defective, incomplete, or failed elements and can wire in known good spare parts. In order to enable such capabilities, a significant number of interconnect layers would be required for WSI. Interconnect layer counts of approximately ten layers have been predicted. In order to implement WSI in a cost-effective manner, several techniques have been proposed, such as using an artificial neural network to develop a programmable topology, using a multichip-scale package, and so on.

Another technique that is being developed to enable wafer scale integration is based on the use of a silicon interposer, as discussed above. The interposer can further include an interposer based on other materials such as glass. The silicon interposer, which can be a wafer, can be used to provide interconnections among a wide variety of components. The components include integrated circuits (chips), chiplets, power supplies, power converters, discrete electrical components, and so on. The interposer provides connection points that can be used to mechanically and electrically mount the chips, chiplets, etc. The interposer can be formed from inorganic materials such as glass or silicon, or organic materials such as those used to manufacture printed circuit boards. The electrical connections can be set to a pitch to simplify the attaching of the electrical elements. The electrical connections can be based on standardized manufacturing techniques such as using solder balls, micro-bumps, controlled collapse chip connection (C4) bumps, and/or electroplated bumps. The bumps on a chip are produced on the "top" side of a wafer (e.g., the non-substrate side) as a final processing step for the wafer. To mount the chips to the interposer, the chips are "flipped" using a flip-chip technique. The bumps at the top of the chips connect to pads on the interposer. The interposer can enable connections from the flip-chip to a standard connection arrangement such as a grid. The interposer can further provide one or more layers of interconnect according to the process used to manufacture the wafer. Thus, higher densities, higher bandwidth, and faster speeds can be achieved. The layers of interconnect are used to provide power and ground, control signals and data, and so on.

Figure 8:
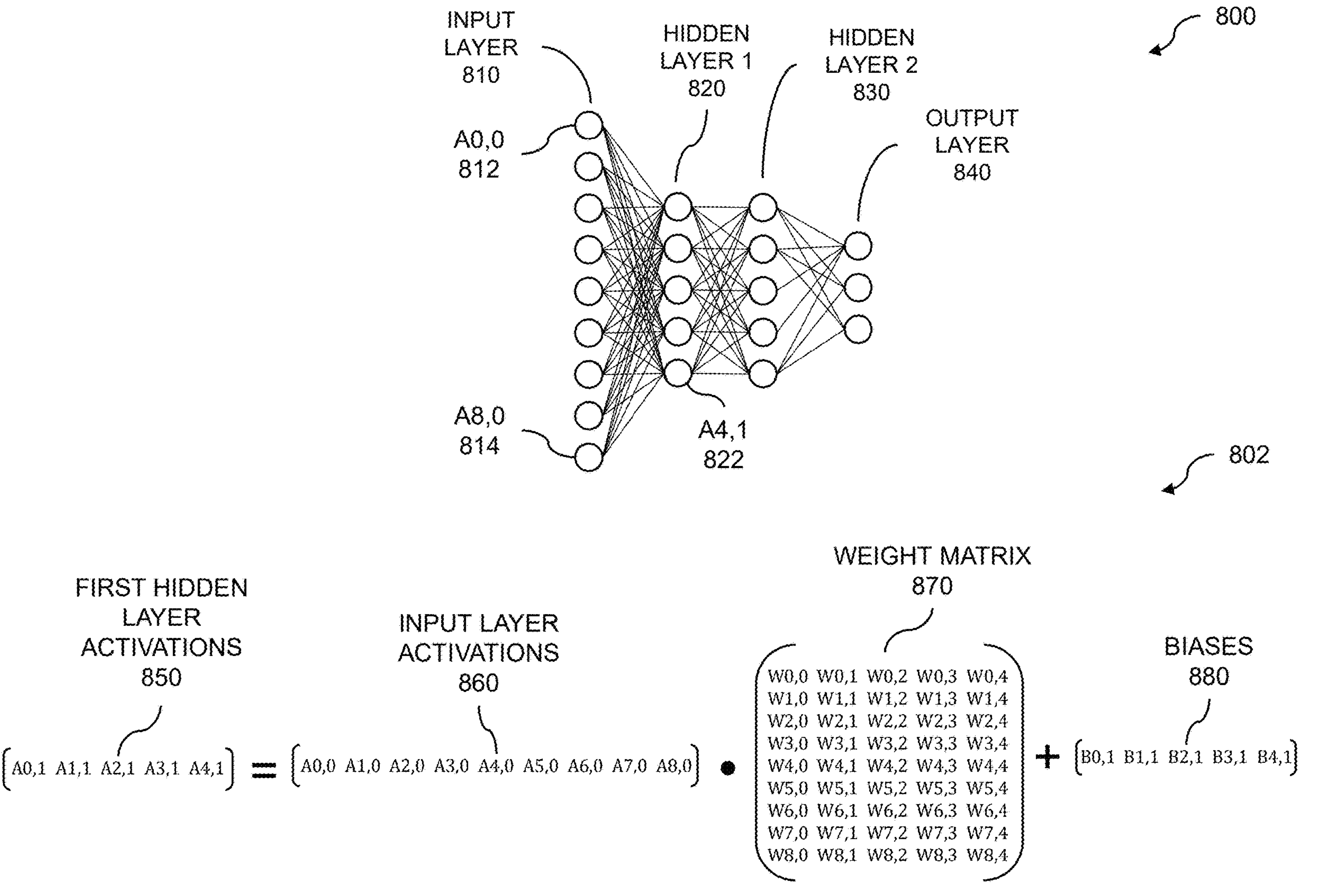
FIG. 8 is an illustration of a neural network.

FIG. 8 is an illustration of a neural network. The neural network (NN) can include a convolutional neural network (CNN). A convolutional neural network can be configured as a type of deep learning system. The deep learning (DL) system can learn or be "trained" using data such as training data provided to the system. The training data can be provided along with "known good" or expected inferences and results. CNNs can be extensively used for image and video recognition, image classification, image segmentation, natural language processing (NLP), and so on. A CNN can use a few (such as tens), or many (such as hundreds, thousands, etc.) of layers of processing units called neurons. The neurons can accomplish calculations which can determine a weighted sum of inputs. The inputs to the neurons can include inputs to the CNN or outputs from previous layers of neurons. The neurons can include a bias which can determine or alter the impact of a neuron on a future neuron (e.g., a neuron in a subsequent layer of the CNN). The neuron can include an activation function such as a sigmoid function, a rectified linear unit (ReLU) normalization function, a hyperbolic tangent (tanh) function, and so on. The activation function is used to ensure that the value calculated by the neuron remains between 0 and 1. The value stored in the neuron can be called an "activation". The neuron can process any type of data including any floating-point format such as single precision floating-point, double precision floating-point, brain floating-point 16 (BF16), BF8, and so on. The neurons can be arranged into layers. The layers can include substantially similar numbers of neurons or different numbers of neurons. The output of a neuron in one layer can be used to feed one or more neurons in another layer. One or more layers can comprise fully connected layers where a neuron in a first layer is connected to each neuron in a previous layer. The various layers and connections between layers can form the basis of an inference operation by the neural network. The neural network can be enabled by back side power delivery for wafer-scale integration with solderless modular power substrates.

The illustration 800 shows an example CNN comprising groups of neurons arranged by layers within a network architecture. The input data for a neuron can come from an original data source, such as a video image, or from a previous layer of neurons. The output value from each neuron can be used to feed one or more neurons in another layer of neurons or can be part of a final output layer. In the illustration 800, the first layer at the left of the figure can be called the input layer 810. Each neuron or processing unit in this layer can receive data directly from a source such as a still camera, video camera, passive infrared (PIR) camera, and so on. Neurons can be numbered for identification. For example, 812 shows a neuron which contains an activation for the first layer at a first neuron. Thus, this neuron can be labeled A0,0. In a similar manner, 814 shows neuron A8,0, which can refer to the ninth neuron in layer 0. This can indicate that there are nine neurons/activations in the first layer (e.g., "layer 0") of the neural network. In practice, any layer can contain any number of neurons. The number of neurons in a given layer can be heuristically determined. Large CNNs can have thousands or millions of neurons at the input layer.

The numeric values calculated by each neuron (called activations) in the input layer can become the input for the next layer of neurons. The next layer of neurons can be a hidden layer. Any number of hidden layers can be included in the neural network. In the illustration 800, the first hidden layer is hidden layer 1 820 and includes five neurons. A second hidden layer 830 is included which also has five neurons. A final layer, an output layer 840, is shown which includes three neurons. The output layer can comprise the final inference from the neural network. For example, if the neural network depicted in 800 comprises a system for determining whether a traffic light was red, yellow, or green, the top activation function/neuron in the output layer could be for red, the middle could represent yellow, and the bottom green. The final value found in each activation within the output layer can comprise a probability. For example, the final output layer could comprise values (from top to bottom) such as 0.01, 0.2, and 0.99. The strength of the network prediction can grow the closer the output value is to 1. Thus, the neural network in this case can indicate a high probability that the light is green.

In practice any number of neurons can be included in any number of hidden layers. A hidden layer within the CNN can include a truncation layer, a bottleneck layer, and so on. The illustration 800 shows that every calculated value from the input layer is connected to every neuron in the first hidden layer. The first hidden layer is described as a fully connected layer. Each connection can be associated with a weight and a bias. Weights and biases can determine how much the value in the current neuron should affect other neurons in the next layer. Thus, the connection between A0,0 812 and A4,1 822 can include a first weight, while the connection between A8,0 814 and A4,1 can include a different weight. A unique bias can be associated with A4,1. The weights can be labeled to make it clear which nodes are coupled between a previous layer and a current layer. For example, for the first hidden layer, W0,0 can couple neuron 0 from the input (previous) layer to neuron 0 in hidden layer 1 (the current layer).

In a similar way, the value for each neuron in the first hidden layer can be determined by a large matrix multiply function as shown in illustration 802. Each activation function in the first hidden layer can be represented by a 1-dimensional vector such as is shown at 850. The activations from the input layer can be shown in another 1-dimensional matrix such as at 860. A 9×5 matrix can be created which includes all weights between the first input layer and the first hidden layer as shown at 870. In practice, the weights can comprise any number of rows and columns according to the size (e.g., number of neurons) of the layers. Finally, the biases associated with each connection from the input layer to the first hidden layer can be represented in a 1-dimensional matrix such as 880. For example, in the illustration 800, the value of A4,1 822 can be the sum of all the weighted (W) inputs from the previous layer, with a final bias added as shown in the following equation: A4,1=[(A0,0*W0,4)+(A1,0*W1,4)+ . . . +(A8,0*W8,4)+B4,1]. As stated previously, the activation A4,1 can include a non-linear transformation such as a sigmoid, ReLU, Tanh, and Softmax. The non-linear transformation function can ensure that the value of the activation remains between 0 and 1 and does not "saturate" with a value or 1 or a value of 0.

Each transition to a different layer within the neural network can require a different matrix multiplication function. Thus, a neural network with many layers can heavily tax a processor core. As the number of neurons/activations within the layers grows, the matrix multiplication function grows increasingly complex. For example, the total number of weights and biases in a neural network can be called the number of parameters in the system. In the case of illustration 800, relatively few parameters have been included. In the first layer, each of the nine neurons is connected to five neurons, with each connection including a weight. A separate bias can be included for each of the five neurons. Thus, in an example configuration, the first layer can include 9×5+5=50 parameters. The second layer includes five neurons connected to another five neurons at the next layer, each connection including a weight. Again, a bias can be included for each neuron. Thus, the parameter count for the second layer as shown is 5×5+5=30. The third layer comprises five neurons with each neuron connected to three neurons in the output layer, where each connection also includes a weight. A bias can be included for each of the three neurons. Thus, the number of parameters is 5×3+3=18. Thus, the number of total parameters in the system can be 50+30+18=98.

Consider a large neural network used for modern large language models. As these networks can comprise billions or trillions of parameters, the matrix multiply function can be exceedingly large. To lessen processing bottlenecks, the matrix multiply functions required, which can include matrices with hundreds, thousands, or even millions of rows and columns, can be separated based on submatrices and can be distributed across many special purpose processors. This technique can decrease the processing time required to perform each matrix multiply. However, this approach can drive bandwidth requirements between many processors and many memory chips as the single large matrix multiply can be split, sent to many processors for execution, collected at a central processor, and then the result must be combined. In large neural networks, this can occur for every inference, driving large memory bandwidth requirements. For example, if 1 billion parameters are used in a neural network, each saved in a single precision floating point format (32-bits), the resulting model could require tens of megabytes (MB) of memory simply to store the parameters of the network. A neural network with 1 trillion parameters could require tens of gigabytes (GB) of memory. As discussed below, training the neural network can drive the need for additional bandwidth as each processor must keep a copy of the previous activations, weights, and biases that are required to perform a matrix multiply. In addition, the training data, which can also be quite large, must be sent. In sum, while neural networks have driven processor improvements, especially in matrix multiply efficiency, the bandwidth needed to keep each processor occupied in a large neural network remains a significant challenge. This can be especially true for some neural networks such as transformers. In these cases, bandwidth requirements of running inferences can place a larger demand on the system than even training (as described below).

Figure 9:
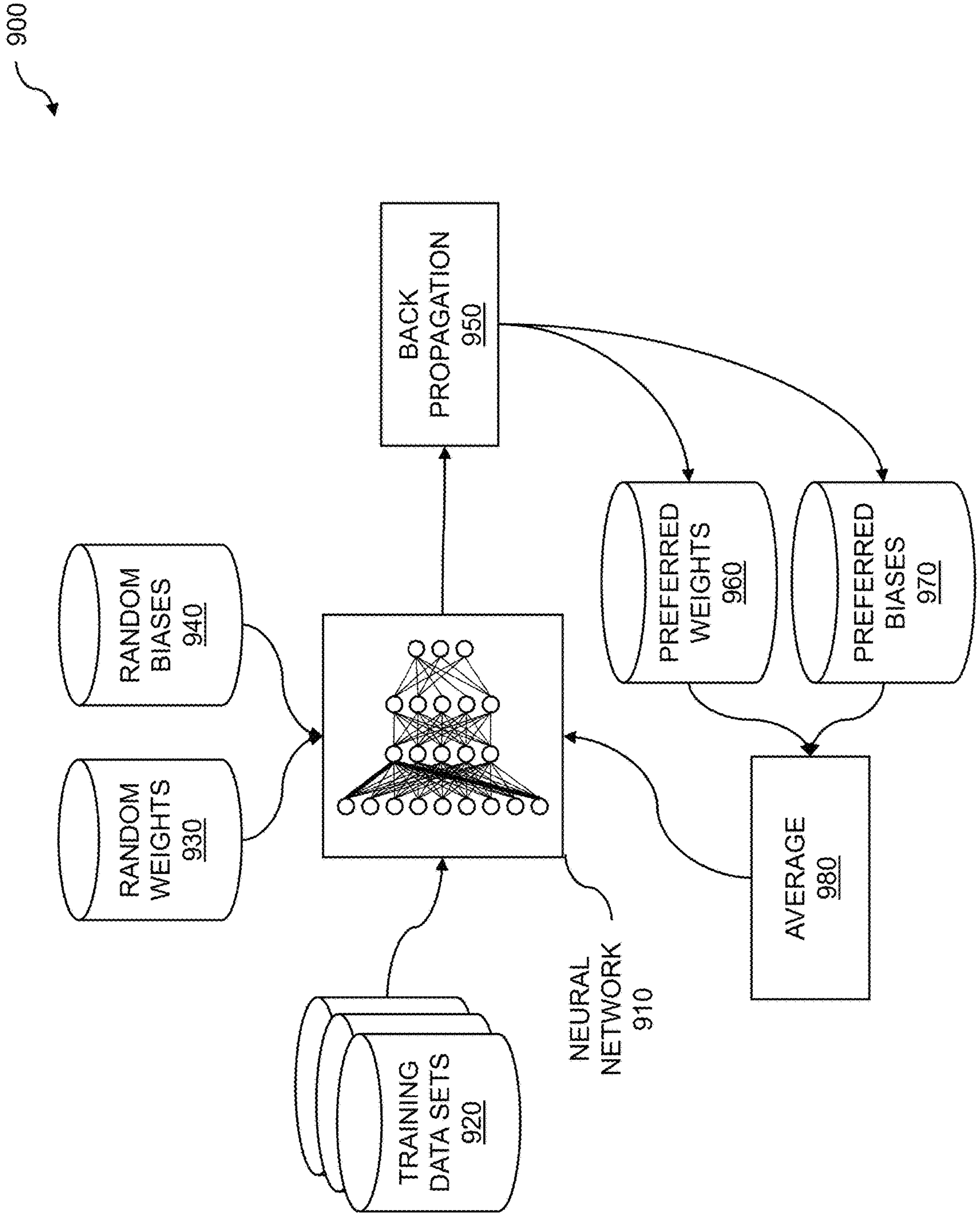
FIG. 9 is an example of training a neural network.

FIG. 9 is an example of training a neural network. A neural network can be trained to accomplish a task. The training the neural network can be based on providing training data and "known good" classifications, inferences, and so on. The task can include identification of objects within an image, facial recognition or speech recognition, data classification, and so on. A neural network, as previously described in illustration 800 above, is shown in example 900 at 910. The neural network can comprise any number of neurons/activations. The neurons/activations can be organized in layers. Training datasets 920 can be provided to the neural network to train the neural network. The training datasets can be based on the type of inference required from the neural network. The inference can be based on a classifier. For example, if it is desired for the network to identify a type of animal, then the training set can include many different types of animals in many different environments, different views of the animals, different numbers of animals, etc. In practice, a large amount of data is required to train a network to properly perform an inference. For example, in video processing/recognition, a rule of thumb can be ten training images per parameter. Thus, a small neural network with 1,000 parameters could have 10,000 images or more for training. If these images are large, the memory requirement to store them can also be large. For example, 10,000 8-bit greyscale images in a resolution of 720×720 pixels could require: (8-bits/pixel)×(518,400 pixels)×(10,000 images)=40.5 GB. The memory requirement would be higher for color images such as RGB images or for higher resolution images. To train a neural network, each of these images can be sent to the input layer of the neural network for training, requiring wide and fast memory connections to the processors performing the training. The training can include training a neural network configured on processors within wafer-scale integration. The training the neural network is supported by wafer-scale integration with a stiffening isometric grid array.

The neural network can begin with a random set of weights 930 and biases 940. In some embodiments, a previous set of weights and biases may be used or may have been obtained prior to training. The previous set of weights and biases can be used in place of purely random values, thereby speeding the training of the neural network. The training process can alter those weights and biases such that an accurate inference can be performed with inputs that the neural network has not previously seen. To train the network, a first image from the first training dataset can be sent to an input layer, as described in the previous figure. Each layer of the neural network can then calculate values based on a weighted sum of each connected neuron in the previous layer. This calculation continues until all neurons in all layers have generated an input. The final values can be captured at the output layer of the neural network. The training can comprise a supervised training. In supervised training, a desired output for each neuron in the output layer can be pre-determined along with each training image. The pre-determined desired output can be a label. A cost function can be created for each training image, which can be obtained by adding the squares of the differences between the result of each neuron in the output layer and the desired result (which can be found in the label of the training data) of that neuron.

The training seeks to reduce the cost function associated with every training image by determining a gradient of the cost function for each image. This can be computed by back-propagation 950. The back-propagation process can determine, for each neuron in the network, what changes should be made to its associated weight and bias to reduce the cost function most effectively. Since a neuron in a layer N is affected by the previous layer N−1, the neurons in N−1 must also be adjusted. Thus, back-propagation can be an iterative algorithm starting from an output layer of the neural network and ending at the input layer. To train the neural network, each image can be processed forward through the neural network and then back-propagated through the network to determine changes necessary for a more accurate inference in the future such as for a next image. This process can be repeated for each image in the training set. Because of the large amount of data required to keep all images in memory, the training data can be randomly divided into datasets which can also be referred to as "mini batches." Training the network can take place on one mini batch at a time to lower bandwidth and compute requirements. For example, the neural network can perform forward processing and back-propagation on the first training image within the first mini batch, resulting in a first set of preferred weights 960 and biases 970. The preferred weights and biases can reflect a desired value for the weight and bias at every neuron to enable more accurate prediction of an output based on the first training image within the first mini batch. The neural network can then perform the same function on a second image, resulting in a second set of preferred weights and biases. This process can be repeated for each image in the mini batch. Once each image in the mini batch is processed, an associated set of preferred weights and biases is computed. Each preferred weight and bias for each node can be averaged 980 to determine the final adjustment that will be made to the actual weights and biases in the network due to the mini batch of images. Once the neural network is updated, another mini batch of training images can be used to further train the network in the same way.

In a usage example, consider a large neural network with billions of parameters and with large matrices that must be calculated to determine each activation. Further consider the large amount of training image data that must be sent to the network and the amount of data that must be maintained during training (including the intermediate weights and biases for each node resulting from each training pass of each image in a mini batch prior to averaging). Finally, consider that a large neural network can be distributed across many functional processors, all with a need to access a relevant portion of the data described above. The memory access and bus or network bandwidth requirements for training such a neural network are extremely high. New methods and technologies can be required to feed such a distributed network.

Figure 10:
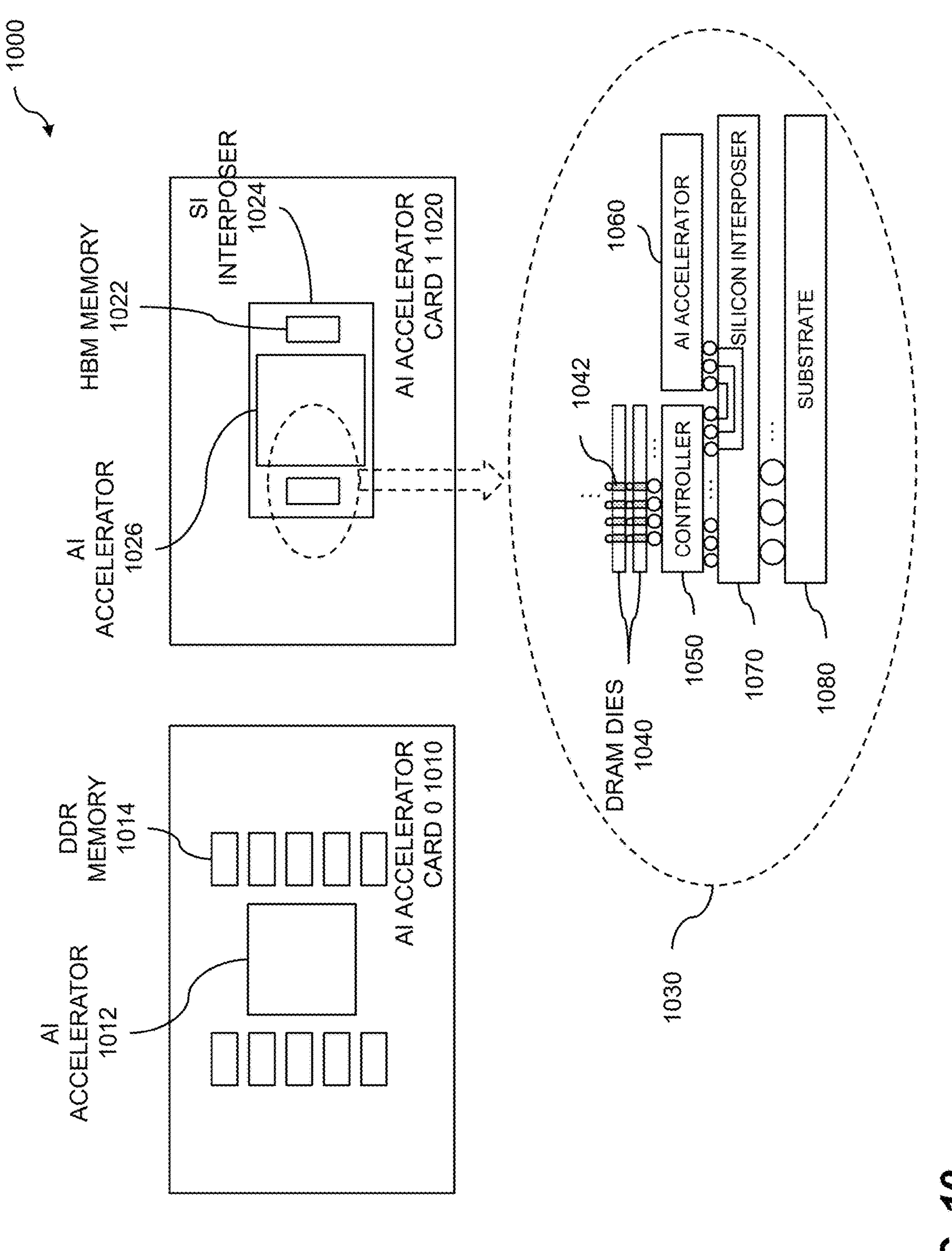
FIG. 10 is an example of enhancing memory bandwidth.

FIG. 10 is an example of enhancing memory bandwidth. As discussed above, modern large neural networks can include billions or even trillions of parameters, requiring many gigabytes of memory or terabytes of memory to simply store the model. Training these large networks can require increasing amounts of memory as thousands, hundreds of thousands, millions, or more samples of images, videos, texts, papers, sentences, and so on must be presented to the neural network. The results generated by the neural network are then back-propagated through the network to determine adjustments for each of the numerous weights and biases comprising the network. Gradients, intermediate values for weights and biases, and so on must also be stored, further pressuring memory bandwidth. Dividing the processing requirements for training and/or inference by the neural network can be straightforward. For example, a matrix multiply function can be divided into multiple smaller submatrix multiply functions, and then assembled to produce the product of the matrix multiply function in a future step. However, handling the bandwidth requirements among processing cores can adversely affect network training time and inference performance. The processing cores can include processing cores within a wafer that enables wafer-scale integration. Enhancing memory bandwidth is supported by back side power delivery for wafer-scale integration with solderless modular power substrates.

Multiple approaches have been used to increase memory bandwidth including using Static DRAM (SDRAM), Double data rate DRAM (DDR), and so on. The example 1000 shows an AI accelerator card 0 1010. The accelerator includes an AI accelerator 1012. The AI accelerator can include processing cores, custom cores, matrix multiply units, multiply accumulators (MACs), and so on. The AI accelerator can be designed specifically to increase the speed of matrix multiplication and other functions associated with the neural network. The AI accelerator card can include DDR memory 1014. The DDR memory can be DDR1, DDR2, DDR3, DDR4, DDR5, and so on. While each generation of DDR memory has improved bandwidth, the memory chips communicate with the AI accelerator only via the AI accelerator card. The DDR memory can comprise any type of memory. While the memory can be physically close to the accelerator, signals must still travel off a silicon die, through a package, across the board, and through another package to the destination die. This can require long cycle times in comparison to the speed of the memory chips and/or AI processors. In addition, the width of the memory buses to the AI accelerator chips and from the AI accelerator chips can be limited due to the need to interface between multiple physical packages.

An improvement in bandwidth can be achieved by 2.5D technology. The illustration 1000 shows an example of 2.5D technology in AI accelerator card 1 1020. In this case, high bandwidth memory (HBM) 1022 can be included on the same silicon interposer 1024 as the AI accelerator 1026. As shown in 1030, two DRAM dies 1040 can be stacked within the HBM memory. In practice, any number of DRAM dies can be stacked. The DRAM chips can communicate with each other and to a memory controller 1050 via through-silicon vias (TSVs) 1042. Although example 1000 shows DRAM chips, in practice, any type of memory chip can be coupled with 2.5D technology, including LPDDR, GDDR, SRAM, VRAM chips, and so on. The controller and the AI accelerator 1060 can be coupled to the same silicon interposer 1070. The coupling can include micro-bumps, controlled collapse chip connections (C4s), and so on. Communications between the memory controller and the AI accelerator can therefore be accomplished within metal layers of the silicon interposer, improving latency, signal integrity, and/or bandwidth as many more wires can be established within the silicon wafer than would have been possible with a typical packaging interface as shown in 1010. Thus, an extremely high bandwidth bus between the memory and AI accelerator can be established. The silicon interposer can be coupled to a substrate 1080 which can be soldered to AI accelerator card 1. This memory implementation can improve a local bandwidth path between memory to a single AI accelerator (which can include many processors). However, for larger neural networks, bandwidth improvements are also required at the system level between multiple AI accelerators.

Figure 11:
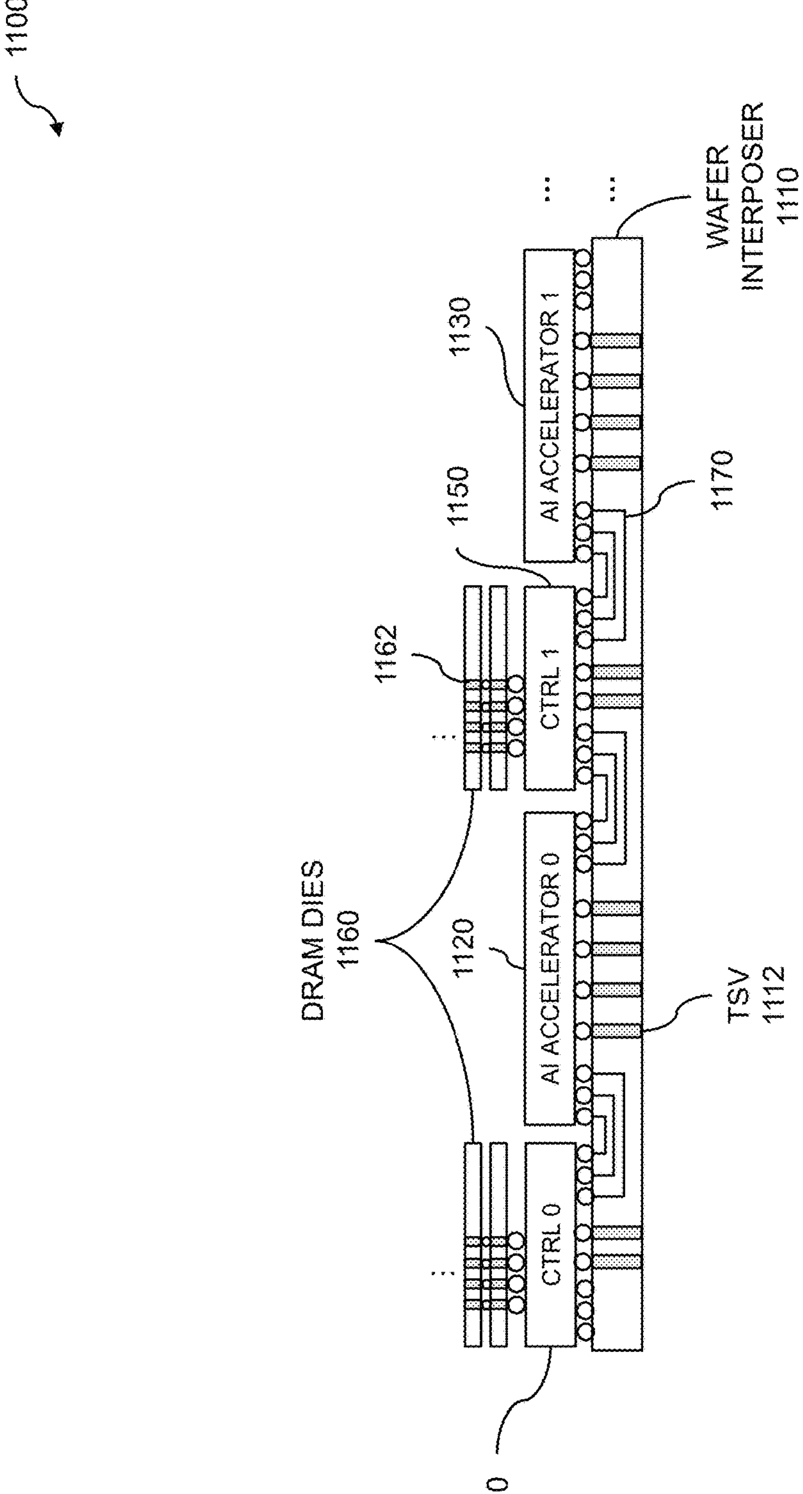
FIG. 11 is a cross-section of wafer scale integration for neural network memory bandwidth.

FIG. 11 is a cross-section of wafer scale integration for neural network memory bandwidth. As described above, a lack of robust and sufficient memory bandwidth, especially for large neural networks, can be performance limiting for the neural network. While memory technology such as 2.5D can improve local memory bandwidth, system-wide memory bandwidth is still a significant technical challenge. Wafer-scale integration can significantly improve these bandwidth requirements by reducing physical separation (e.g., shorter interconnect lengths) between the memory and the processors that are accessing it. The wafer-scale integration includes back side power delivery for wafer-scale integration with solderless modular power substrates. The modular power substrates can be stiffened based on reinforcement rings. The reinforcement rings can be deposited on each MPS, glued to each MPS, and so on. The reinforcement ring on each MPS within the plurality of MPSs maintains a coplanarity of each MPS in the plurality of MPSs. The coplanarity enables reliable connectivity between a back side of the WSSI and the plurality of MPSs using compression connectors.

The cross-section 1100 shows a wafer interposer 1110. In a usage example, multiple chips such as AI accelerator chips, ML accelerator chips, processors, etc. can be bonded to the wafer interposer. The wafer interposer can include an inorganic wafer such as a silicon wafer or a glass wafer; an organic wafer comprising an organic material such as that used for printed circuit boards; etc. The wafer interposer can comprise a 300 mm wafer, a 200 mm wafer, and so on. The wafer interposer can include any number of through-silicon vias (TSVs) 1112. The TSVs can enable communications between a front side and a back side of the wafer. For example, power can be delivered to the interposer through the back side of the wafer based on the TSVs. To reliably process the TSVs, the back side of the wafer can be ground, polished, and so on to reduce the thickness of the wafer. A plurality of AI accelerators, such as AI accelerator 0 1120 and AI accelerator 1 1130 can be coupled to the wafer interposer. The coupling can include micro-bumps, C4s, and so on. The AI accelerators can be coupled to a plurality of memory controllers, such as memory controller 1140, 1150, and so on. The memory controllers can be based on SDRAM, DDR1, DDR2, DDR3, DDR4, DDR5, HBM, and so on. The memory controllers can be coupled to any number of memory chips. The memory chips can be based on 2.5D technology, which can enable stacking of one or more memory dies such as DRAM dies 1160. The stack of memory dies can enable a hybrid memory cube (HMC). The memory dies can communicate to other memory dies and to the respective controller by TSVs 1162. The memory can be coupled to one or more AI accelerators by wiring paths 1170 within the wafer interposer. Though AI accelerators and memory chips are shown in cross section 1100, in practice any types of chips including processors, system-on-chips (SoCs), application-specific integrations circuits (ASICs), and so on can be incorporated. The wafer interposer can be processed using a back-end-of-line (BEOL) wafer process which can include any number of metal layers. These metal layers can be used to couple any AI accelerator to any memory controller. The wafer metal layers can provide extremely high bandwidth between any memory controller and any AI processor on the wafer.

The wafer scale integration approach shown in FIG. 11 can address the system level bandwidth requirements necessary for computationally intensive processing applications such as large neural networks (NNs). The large neural networks can include convolutional neural networks (CNN). Recall that neural networks with parameter sizes into the billions or trillions can require significant memory for a model executing on the neural network. Recall also that training a large neural network can require a substantial number of training images that can be ten times (or more) the number of parameters. Each of these models must be presented to the network for a forward training pass and back-propagation training pass. Multiple intermediate sets of weights and biases for each node in the neural network can also be stored and maintained though the training process. Further, because the matrix functions for larger neural networks are far too large for any single processor, the processing mentioned above can be divided or partitioned into smaller processing jobs and sent to many processors. The many processors can span many chips, cards, server racks, or even data centers. While adding additional processors can be straightforward (though expensive), keeping those processors efficiently running can be an extremely difficult task, often gated by memory bandwidth. The memory bandwidth can become a gating processing performance factor because relevant data must be sent to every processor, regardless of the location of the processor. Wafer scale integration can reduce bandwidth bottlenecks between many AI accelerators (which can comprise many processor cores, specialized AI cores, specialized ML cores, accelerators, and so on) and significant amounts of memory. As a result, an entire medium to large size neural network can be fully trained and can run inferences on a single wafer interposer. For larger models, such as ChatGPT, any number of wafer interposers can be coupled together to provide a significant improvement in bandwidth and computation speed.

Figure 12:
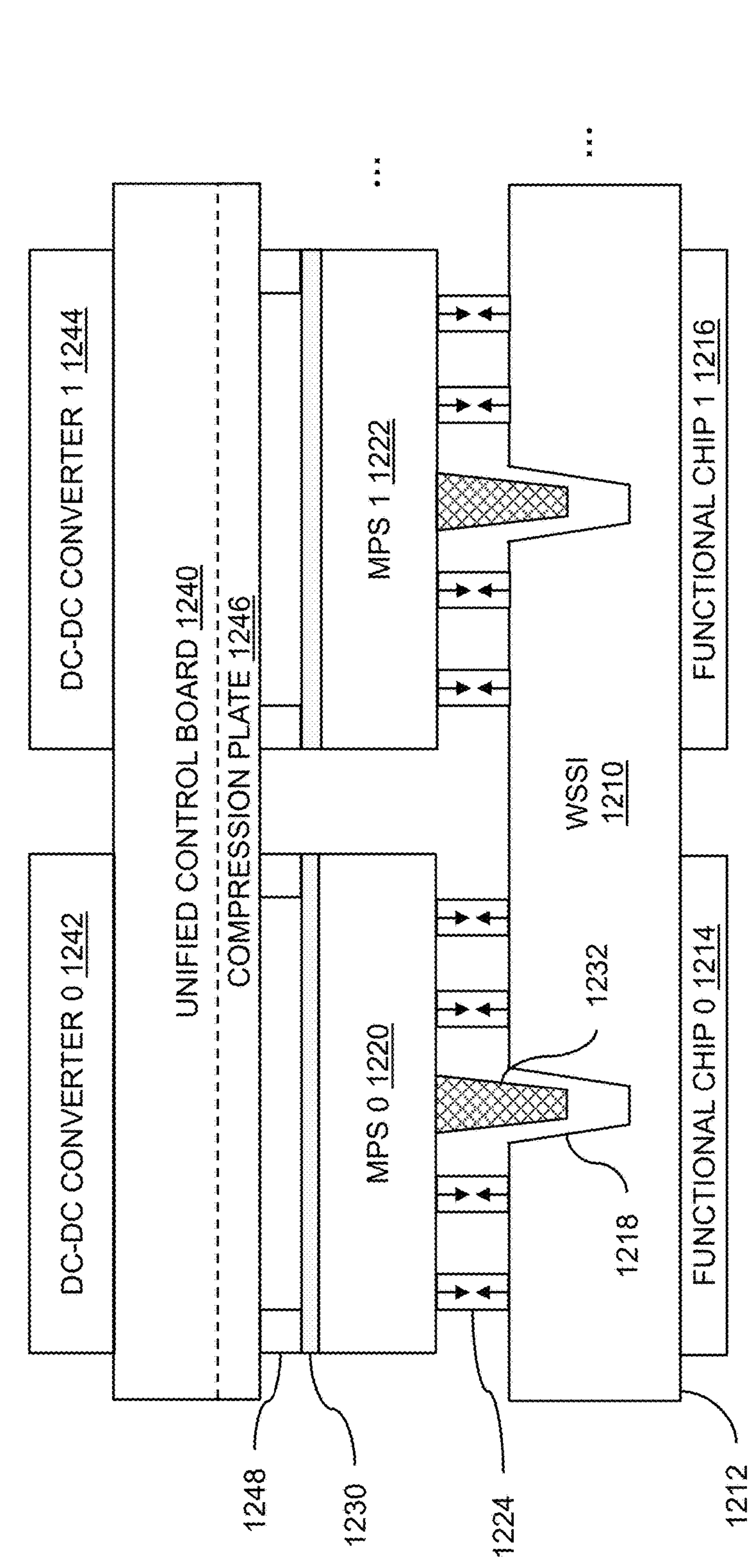
FIG. 12 is an illustration of extensions and grooves.

FIG. 12 is an illustration of extensions and grooves. Discussed previously and throughout, a plurality of modular power substrates (MPSs) can be attached to a back side of a wafer-scale silicon interposer (WSSI), where the attaching is based on compression connectors. The MPSs are also mechanically connected to a unified control board (UCB). The UCB can include DC-to-DC converters that can be used to provide DC power at a first voltage to the MPSs. The MPSs can in turn convert power received from the UCB and send the converted power at a second voltage to the WSSI. Recall that the WSSI can be ground and polished to accomplish a WSSI thin enough to support through-silicon vias (TSVs). The TSVs provide power from the plurality of MPSs to functional chips bonded to a top side of the WSSI. In order for the compression connectors to provide a reliable connection between the MPSs and the WSSI, a force can be applied to the unified control board (UCB). Posts or prongs associated with the UCB can be used to transfer force applied to the UCB to the MPSs. The WSSI and the UCB can expand at different rates due to different CTEs. Thus, the MPSs that are attached to the UCB can also move, which can cause the compression connections between the WSSI and the MPSs to lose connectivity. To mitigate this movement, as explained previously, the MPS can be designed modularly. Further, the socket, which can be a high-power socket, a high voltage socket, etc., can comprise a compliant connector. To further mitigate the movement due to CTE mismatch, each MPS can include an extension. The MPS extensions can align with grooves in the WSSI, thus enabling alignment of compression connectors between the MPSs and the WSSI during expansion. The extensions associated with the MPSs, and the grooves associated with the WSSI enable back side power delivery for wafer-scale integration with solderless modular power substrates.

A wafer-scale silicon interposer (WSSI) is accessed. A front side of the WSSI is bonded to a plurality of functional chips. The WSSI includes a plurality of through-silicon vias (TSVs). A plurality of modular power substrates (MPSs) is connected mechanically to a unified control board (UCB). The UCB includes a plurality of DC-to-DC power converters. The plurality of MPSs is attached to a back side of the WSSI. The attaching is based on a plurality of compression connectors. The attaching is based on a compression force from the UCB, and the attaching couples each MPS to one or more functional chips within the plurality of functional chips. DC power is sent, by the UCB, to the plurality of functional chips. The sending is based on the plurality of DC-to-DC power converters, the plurality of MPSs, and the plurality of TSVs.

The illustration 1200 includes a wafer-scale silicon interposer (WSSI) 1210. The WSSI can comprise silicon, glass, and so on. One or more functional chips can be bonded to a front side of the WSSI 1212. In the figure, two functional chips are shown, functional chip 0 1214 and functional chip 1 1216. While two functional chips are shown, other numbers of functional chips can be bonded to the front side of the WSSI. Embodiments include creating a plurality of grooves on a back side of the WSSI. A groove 1218 is shown. The grooves on the back side of the WSSI can receive one or more extensions associated with one or more modular power substrates (described below). Embodiments include attaching, to a back side of the WSSI, the plurality of MPSs. The MPSs can include MPS 0 1220 and MPS 1 1222. While two MPSs are shown, other numbers of MPSs can be associated with the plurality of MPSs.

In embodiments, the attaching is based on a plurality of compression connectors. An example compression connector 1224 is shown. Any number of compression connectors can be used for attaching the plurality of MPSs. Recall that the WSSI can be ground and polished to a thin dimension in order to support TSVs associated with the WSSI. As a result, the WSSI can deflect, crack, or break under force. Thus, force applied to the MPSs must be applied as uniformly as possible across the MPSs. Further, recall that the pressure to engage the compression connectors at the back side of the WSSI can be delivered by the MPS as the UCB pushes the MPSs via a power connector. The power connector can be located in the middle of the MPS. However, the MPS may not be completely planar, and the force applied at the middle of the MPS may not be enough to fully engage the compression connectors throughout the underside of the MPSs where they connect with the WSSI. To maintain planarity of the MPS and to provide uniform compression force to engage the compression connectors at the back of the WSSI, stiffening techniques can be applied. Embodiments include stiffening each MPS in the plurality of MPSs. The stiffening is based on a reinforcement ring on each MPS within the plurality of MPSs. A reinforcement ring associated with MPS 0 is shown 1230. In embodiments, the reinforcement ring on each MPS within the plurality of MPSs maintains a coplanarity of each MPS in the plurality of MPSs. The reinforcement ring can be formed on each MPS. Embodiments include depositing, on each MPS within the plurality of MPSs, the reinforcement ring. The depositing the reinforcement rings can be based on a deposition technique such as chemical vapor deposition (CVD). Further embodiments include gluing, to each MPS within the plurality of MPSs, the reinforcement ring. The gluing can be based on an adhesive such as an epoxy, a cyanoacrylate, and so on.

The WSSI and the UCB can expand at different rates due to different CTEs. Thus, the MPSs that are attached to the UCB can also move, which can cause the compression connections between the WSSI and the MPSs to crack, lose connectivity, etc. To mitigate this movement, as explained previously, the MPS can be designed modularly, effectively isolating movement between MPSs. In addition, the socket, which can be a high-power socket, a high voltage socket, etc., can comprise a compliant connector. To further mitigate the movement due to CTE mismatch, in embodiments, each MPS in the plurality of MPSs includes an extension 1232, wherein the extension included within each MPS is inserted in a groove in the plurality of grooves. The extension can be deposited onto each MPS, glued to each MPS, and so on. When the MPS extensions are aligned with grooves in the WSSI, alignment of compression connectors between the MPSs and the WSSI during expansion is enabled. The extensions associated with the MPSs, and the grooves associated with the WSSI, enable back side power delivery for wafer-scale integration with solderless modular power substrates.

The FIG. 1200 includes a unified control board (UCB) 1240. The UCB includes a plurality of DC-to-DC power converters. In the figure, the DC-to-DC converters can include DC-DC converter 0 1242 and DC-DC converter 1 1244. While two DC-to-DC converters are shown associated with the UCB, other numbers of DC-to-DC converters can be associated with the UCB. The DC-to-DC power converters can convert DC power from a high voltage range to a low voltage range (e.g., buck conversion). In a usage example, the DC-to-DC converters can convert DC power from a high voltage range, such as 48 volts to 54 volts, to a lower voltage range, such as 12 volts to 13.5 volts. The higher voltage range can be a voltage range normally supplied to racks within a data center. In embodiments, the plurality of modular power substrates (MPSs) is connected to the unified control board. An MPS can include a connector, where the connector can be used to connect mechanically the MPS to the UCB. The connector can comprise a socket (not shown) on the UCB. The socket can comprise a high-power socket, a high voltage socket, and so on. The mechanical connection can include one or more plugs, pins, etc. from the UCB which can be inserted into the socket. The connector can include a power connector. In addition to the power connector, the MPS can include a rigid-flex strip (not shown). The rigid-flex strip can provide a mechanical connection between the MPS and a UCB. A plurality of rigid-flex strips can provide control signals, data, and so on. In a usage example, the mechanical connection can include a plurality of rigid-flex strips. The plurality of rigid-flex strips can include one or more power control signals from the digital controller chip to the plurality of MPSs. The plurality of rigid-flex strips can carry at least a portion of DC power from the plurality of MPSs to the plurality of functional chips. The rigid-flex strips can include a socket into which one or more plugs, pins, etc. can be inserted to couple the rigid-flex strip to the UCB.

In the figure, the UCB comprises a compression plate 1246 for the plurality of compression connectors. The compression plate can enable transfer of a compression force applied from the UCB to each MPS within the plurality of MPSs. Recall that a reinforcement ring is used to stiffen each MPS. The compression force applied to the UCB can be transferred from the UCB to the reinforcement rings, thereby reducing the risk of skewing, deforming, displacing, etc. the MPSs. In embodiments, the UCB includes a plurality of compression prongs. An example compression prong 1248 is shown. In embodiments, the plurality of compression prongs contacts the reinforcement ring on each MPS in the plurality of MPSs. Noted above, the plurality of MPSs is attached to a back side of the WSSI, where the attaching is based on the plurality of compression connectors. In embodiments, the attaching includes applying a compression force to the UCB, wherein the compression force is delivered to the plurality of compression connectors by the compression prongs. The compression force enables one or more reliable connections between the MPSs and the WSSI using the compression connectors.

Figure 13:
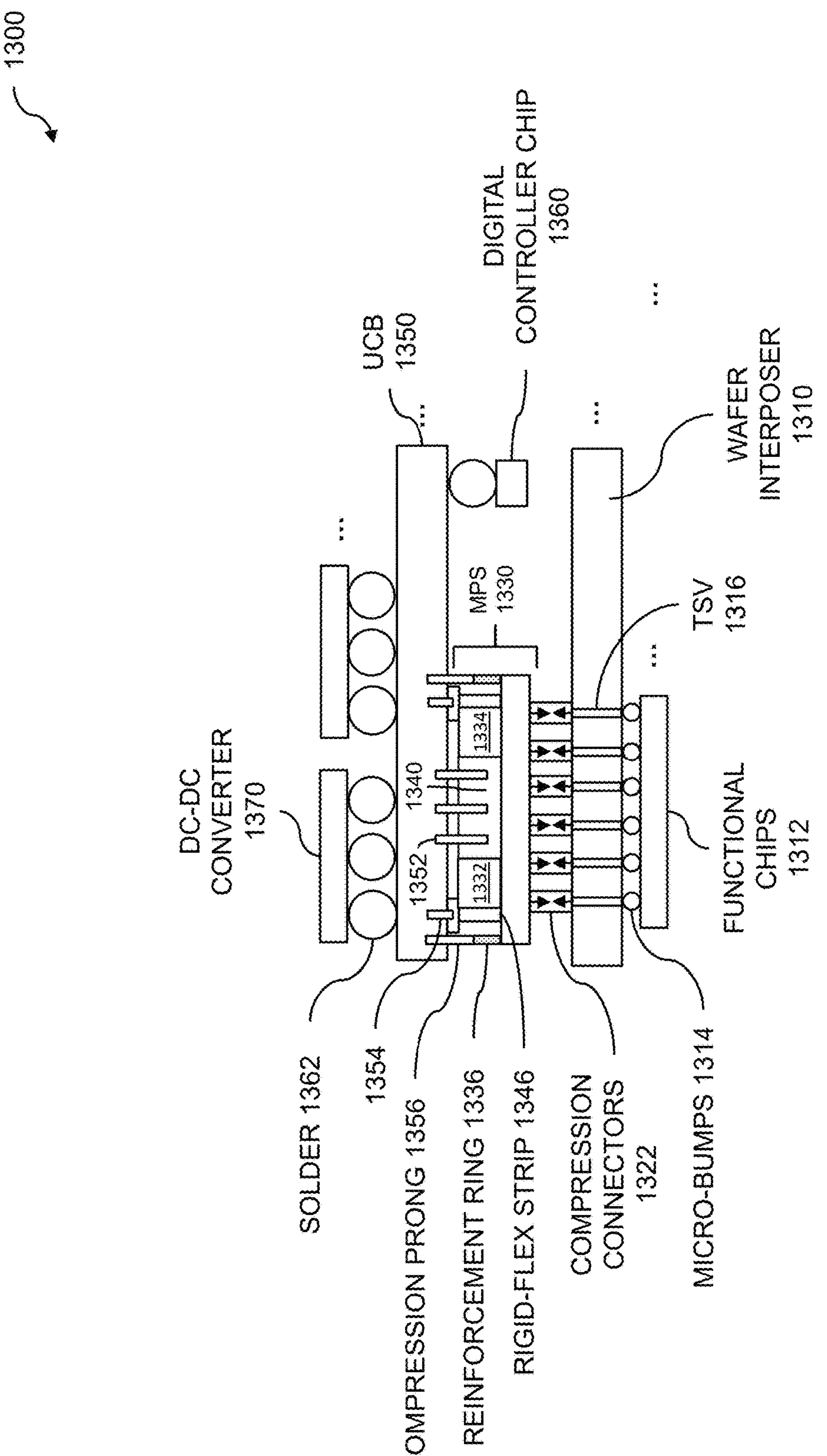
FIG. 13 is a cross-section of an apparatus for back side power delivery for wafer-scale integration with solderless modular power substrates.

FIG. 13 is a cross-section of an apparatus for back side power delivery for wafer-scale integration with solderless modular power substrates (MPSs). The modular power substrates can be used to transfer force exerted by a unified control board (UCB) to secure compression connectors that enable attaching a plurality of modular power substrates to a wafer-scale silicon interposer (WSSI). Each MPS can be stiffened based on a reinforcement ring attached to each MPS. The reinforcement ring on each MPS within the plurality of MPSs maintains a coplanarity of each MPS in the plurality of MPSs. The coplanarity of each MPS enables reliable connections between the MPSs and the WSSI using compression connectors. TSVs can be used to provide connections between a front side of the WSSI and a back side of the WSSI. The WSSI can be used to achieve wafer-scale integration (WSI). The WSSI can be used to mount various elements such as electrical elements and to provide interconnections among the mounted elements. The silicon interposer can include other inorganic materials such as glass. An apparatus for power delivery is disclosed comprising: a wafer-scale silicon interposer (WSSI), wherein a front side of the WSSI is bonded to a plurality of functional chips, wherein the WSSI includes a plurality of through-silicon vias (TSVs); a plurality of modular power substrates (MPSs), wherein the plurality of MPSs is attached to a back side of the WSSI by a plurality of compression connectors; and a unified control board (UCB), wherein the UCB is mechanically connected to the plurality of MPSs, wherein the UCB comprises a compression plate for the plurality of compression connectors, wherein the UCB includes a plurality of DC-to-DC converters, wherein the UCB sends DC power to the plurality of functional chips bonded to the WSSI, and wherein the sending is based on the plurality of MPSs and the plurality of TSVs.

The apparatus 1300 includes a wafer interposer 1310, wherein a front side of the WSSI is bonded to a plurality of functional chips, wherein the WSSI includes a plurality of through-silicon vias (TSVs). The wafer interposer can include an interposer that enables wafer-scale integration (WSI). The wafer interposer can include inorganic materials or organic materials. In embodiments, the interposer includes a wafer-scale silicon interposer (WSSI). Inorganic materials other than silicon can also be used. In a usage example, the wafer interposer can include a glass interposer. Micro-bumps discussed above can be used to mount the one or more functional chips to the front side of the wafer interposer. Communications between the functional chips can be accomplished within metal layers of the silicon interposer, thereby reducing latency and parasitics such as resistance, capacitance, and inductance, enabling improvement of signal integrity and/or bandwidth, etc. The reductions and improvements result from the opportunity for many more wires being established within the silicon wafer compared to what would have been possible with a typical packaging interface. Thus, the WSSI can enable extremely high bandwidth buses and control signals between chips mounted to the WSSI. The WSSI can include one or more optical waveguides. The optical waveguides can enable chip-to-chip communications via one or more wavelengths of light. The optical waveguides can comprise the buses and control signals between chips. The wafer interposer can also be used to attach additional boards, modules, components and so on. The further attachments can be located on the opposite side of the of the wafer interposer from the mounted functional chips.

The apparatus 1300 includes a plurality of functional chips 1312. The functional chips can include a processor chip, a multi-core processor chip, a graphics processor chip, a system-on-a-chip, a memory chip, an application-specific integrated circuit (ASIC), an artificial intelligence (AI) or machine learning (ML) accelerator, and so on. The functional chips can include an integrated circuit designed for a flip-chip application. A chip design for a flip-chip application can include a chip for which connections to the chip are accomplished at the top layer of the chip. The connections can include positive and negative DC power connections, data connections, control connections, and so on. The various chip connections can include pads on the top layer of the chips. The functional chips can include a chip that can accomplish a processing function such as a deep learning function.

Various techniques can be used to make connections to the top of a functional chip. In a usage example, a technique based on micro-bumps 1314 can be used. A micro-bump can be associated with each connection point or pad on each chip. The micro-bumps can comprise a dense array of connection points or pads. The micro-bumps can include a material appropriate for mounting the chip to a substrate, a board, an interposer, and so on. The micro-bumps can include solder micro-bumps. These micro-bumps can be arranged in a ball grid array (BGA) or some other geometry. Note that the plurality of functional chips create heat during operation. The heat can be due to active current, overcurrent, leakage current, and so on. The heat can result from IR heating within the functional chips. The WSSI includes a plurality of through-silicon vias (TSVs) 1316. The TSVs can provide a connection between the micro-bumps on the top side of the WSSI and the compression connectors on the bottom side of the WSSI. The TSV connections can be used to deliver power to the functional chips through the back side of the WSSI.

The apparatus 1300 includes a plurality of modular power substrates (MPSs) 1330, wherein the plurality of MPSs is attached to a back side of the WSSI by a plurality of compression connectors. An MPS can be coupled to one or more elements associated with the WSSI. In embodiments, each MPS in the plurality of MPSs is coupled to one or more functional chips within the plurality of functional chips. An MPS can be based on a form factor. The form factor of the MPS can be associated with or dependent on components mounted to the wafer interposer. In a usage example, the plurality of MPSs can be based on a form factor mirroring the corresponding functional chip. The form factor of the MPS can have a 1:1 relationship to the one or more corresponding functional chips or can include other shape factors. The MPSs can be based on a variety of materials. In a usage example, one or more MPSs within the plurality of MPSs comprise an inorganic substrate. An inorganic substrate can include a silicon substrate, a glass substrate, and so on. In another usage example, one or more MPSs within the plurality of MPSs comprise an organic substrate. The organic substrates can include substrates such as printed circuit boards. Recall that the functional chips are mounted to the front or top side of the WSSI. In embodiments, the plurality of MPSs is attached to a back side of the WSSI. Connections between the wafer interposer and the MPS can be accomplished using the compression connectors (described below).

The MPS 1330 can include a plurality of step-down power modules and/or DC-to-DC converters such shown at 1332 and 1334. As shown in a previous diagram, the DC-to-DC converters on an MPS can be placed across the MPS. The DC-to-DC converters on the MPSs can accomplish altering of a DC voltage. The altering the DC voltage can result in a second DC voltage. In a usage example, the power can be altered, wherein altering, by the plurality of MPSs, is accomplished by the DC power that was sent, and wherein the altering is based on a second voltage conversion. The second voltage conversion can include a second DC-to-DC voltage conversion. In embodiments, the second voltage conversion results in a voltage less than a threshold. The threshold can include a voltage appropriate to a voltage required by a functional chip. In embodiments, the threshold can include 1 volt.

In apparatus 1300, the plurality of MPSs is attached to a back side of the WSSI by a plurality of compression connectors 1322. The compression connectors can include one or more varieties of connectors. In embodiments, the plurality of compression connectors includes a plurality of spring-loaded pins. The spring-loaded pins can move into place under compression, thereby enabling a connection. In embodiments, the plurality of compression connectors includes a plurality of wire nest contacts. Further types of compression connectors can be used. In embodiments, the plurality of compression connectors includes a plurality of elastomers with embedded balls. The embedded balls within the elastomers can enable electrical contacts between an MPS (discussed below) and the WSSI. In further embodiments, the plurality of compression connectors includes a plurality of cantilever contacts. The cantilever contacts can defect under compression. The force returned by the cantilever can enable a reliable electrical connection. The wafer interposer can provide connections between the compression connectors on one side of the wafer interposer and the other side of the wafer interposer.

In embodiments, the apparatus 1300 includes a plurality of reinforcement rings, wherein each reinforcement ring 1336 in the plurality of reinforcement rings stiffens each MPS in the plurality of MPSs, respectively. The MPS can be stiffened for a variety of purposes. Recall that MPSs are attached to the back side of the WSSI based on a plurality of compression connectors. In order to form a reliable connection between the MPS and the WSSI using the compression connectors, a force sufficient to enable the compression connectors must be applied substantially equally across the plurality of MPSs. In embodiments, the reinforcement ring on each MPS within the plurality of MPSs maintains a coplanarity of each MPS in the plurality of MPSs. The coplanarity of each MPS can enable connection by the compression connectors without causing the WSSI to deflect, crack, fracture, and so on. The reinforcement ring can be formed using a variety of techniques. Embodiments include depositing, on each MPS within the plurality of MPSs, the reinforcement ring. The reinforcement ring can be deposited using a fabrication technique such as chemical vapor deposition (CVD). Other embodiments include gluing, to each MPS within the plurality of MPSs, the reinforcement ring. The gluing can be accomplished using adhesives such as an epoxy, cyanoacrylate, and so on.

In embodiments, the apparatus 1300 includes a plurality of compression prongs 1356, wherein the plurality of compression prongs contacts a reinforcement ring on each MPS in the plurality of MPSs. A force can be applied to reinforcement rings associated with the MPSs in order to engage reliable connections, by the compression connectors, which enable coupling between the plurality of MPSs and the WSSI. A force can be transferred to the reinforcement rings associated with the plurality of MPSs. The force can be transferred using one or more compression prongs. In embodiments, the plurality of compression prongs applies a compression force to the UCB, wherein the compression force is delivered to the plurality of compression connectors. The one or more compression prongs can be associated with a circuit board that can be connected to the plurality of MPSs. The circuit board can include a unified control board (discussed below). In embodiments, the UCB includes a plurality of compression prongs, wherein the plurality of compression prongs contacts a reinforcement ring on each MPS in the plurality of MPSs. The compression prongs can be fabricated on the UCB, glued to the UCB, and so on.

The apparatus 1300 includes a unified circuit board (UCB) 1350, wherein the UCB is mechanically connected to the plurality of MPSs, wherein the UCB comprises a compression plate for the plurality of compression connectors, wherein the UCB includes a plurality of DC-to-DC converters, wherein the UCB sends DC power to the plurality of functional chips bonded to the WSSI, and wherein the sending is based on the plurality of MPSs and the plurality of TSVs. The MPS discussed previously can be mechanically connected to a unified control board (UCB). An MPS can include a connector, where the connector can be used to mechanically connect the MPS to the UCB. The connector can comprise a socket 1340 on the UCB. The socket can comprise a high-power socket. The mechanical connection can include one or more plugs, pins, etc. 1352 from the UCB which can be inserted into the socket. In a usage example, the mechanical connection can be based on a high voltage socket, wherein the high voltage socket transfers power from the UCB to the plurality of MPSs. The high voltage socket can be used to provide a first DC voltage that can be converted to a second DC voltage by one or more DC-to-DC converters. The mechanical connection can accommodate a maximum lateral displacement of the UCB due to thermal expansion during operation. The lateral displacement can result from thermal expansion of the WSSI, the UCB, and/or the MPS during operation. In addition to the power connector, the MPS can include a rigid-flex strip 1346. The rigid-flex strip can provide a mechanical connection between the MPS and a UCB. The plurality of rigid-flex strips can provide control signals, data, and so on. In embodiments, the mechanical connection can include a plurality of rigid-flex strips. The plurality of rigid-flex strips can include one or more power control signals from the digital controller chip to the plurality of MPSs. The plurality of rigid-flex strips can carry at least a portion of DC power from the plurality of MPSs to the plurality of functional chips. The rigid-flex strips can include a socket into which one or more plugs, pins, etc., such as 1354, can be inserted to couple the rigid-flex strip to the UCB.

The UCB can include a plurality of DC-to-DC power converters. As described above, each DC-to-DC power converter in the plurality of DC-to-DC power converters can include a mechanical connection to a respective MPS in the plurality of MPSs. The mechanical connection between each DC-to-DC converter and a respective MPS can enable power transfer, control, and so on. The mechanical connections between the plurality of DC-to-DC converters and the plurality of MPSs can remain reliable when the DC-to-DC converters and the MPSs are operating. The mechanical connection can accommodate a maximum lateral displacement of the UCB due to thermal expansion during operation. The handling a maximum lateral displacement is critical to maintaining reliable mechanical connections between and among components, the WSSI, one or more UCBs, one or more MPSs, and so on.

The UCB 1350 can include a digital controller chip 1360. The digital controller chip can control power delivery to the plurality of functional chips. The controlling power delivery can include enabling or disabling power transfer, controlling an input voltage to and an output voltage from a DC-to-DC converter, and the like. Recall that the MPS can include a plurality of rigid-flex strips that can accommodate lateral displacement of the UCB due to thermal expansion during operation. The rigid-flex strips can accomplish other functions. In a usage example, the plurality of rigid-flex strips can include one or more power control signals from the digital controller chip to the plurality of MPSs. The control signals can enable and disable elements such as controller chips and DC-to-DC converters, can provide instructions to controller chips, etc. In a further usage example, the plurality of rigid-flex strips can carry at least a portion of DC power from the plurality of MPSs to the plurality of functional chips.

The apparatus 1300 can include one or more solder bumps 1362. The solder bumps can be positioned on a side of the UCB opposite the side of the UCB that includes the mechanical connections to the MPSs. The solder bumps can be placed on contacts or pads. The solder bumps can be arranged in an array pattern such as a regular array pattern. The solder bumps can be placed on fewer pads than a regular array. The apparatus 1300 can include a DC-to-DC converter 1370. The DC-to-DC converters can convert a first DC voltage to a second DC voltage. The DC-to-DC converters can be controlled by a control chip associated with the UCB. The DC-to-DC converters can be coupled to the UCB using the solder bumps. A usage example can include matching each DC-to-DC power converter within the plurality of DC-to-DC power converters included on the UCB to one or more respective MPSs in the plurality of MPSs. DC power from a DC-to-DC converter can be sent to an MPS via an interconnect on the UCB. DC power can be fed to the DC-to-DC converters.

As explained above and throughout, the WSSI and the UCB can expand at different rates due to different CTEs. Thus, the MPSs that are attached to the UCB can also move, which can cause the compression connections between the WSSI and the MPSs to crack, lose connectivity, etc. To mitigate this movement, as explained previously, the MPS can be designed modularly, effectively isolating movement between MPSs. In addition, the socket, which can be a high-power socket, a high voltage socket, etc., can comprise a compliant connector. In embodiments, the apparatus 1300 includes a plurality of grooves on the back side of the WSSI (not shown). In embodiments, each MPS in the plurality of MPSs includes an extension, wherein the extension included in each MPS is inserted in a groove in the plurality of grooves. The extensions are not shown in the apparatus 1300, but are shown in illustration 1200. The extensions and grooves can further mitigate movement due to CTE mismatch. The extension can be deposited onto each MPS, glued to each MPS, and so on. When the MPS extensions are aligned with grooves in the WSSI, alignment of compression connectors between the MPSs and the WSSI during expansion is enabled. The extensions associated with the MPSs, and the grooves associated with the WSSI, enable back side power delivery for wafer-scale integration with solderless modular power substrates.

Figure 14:
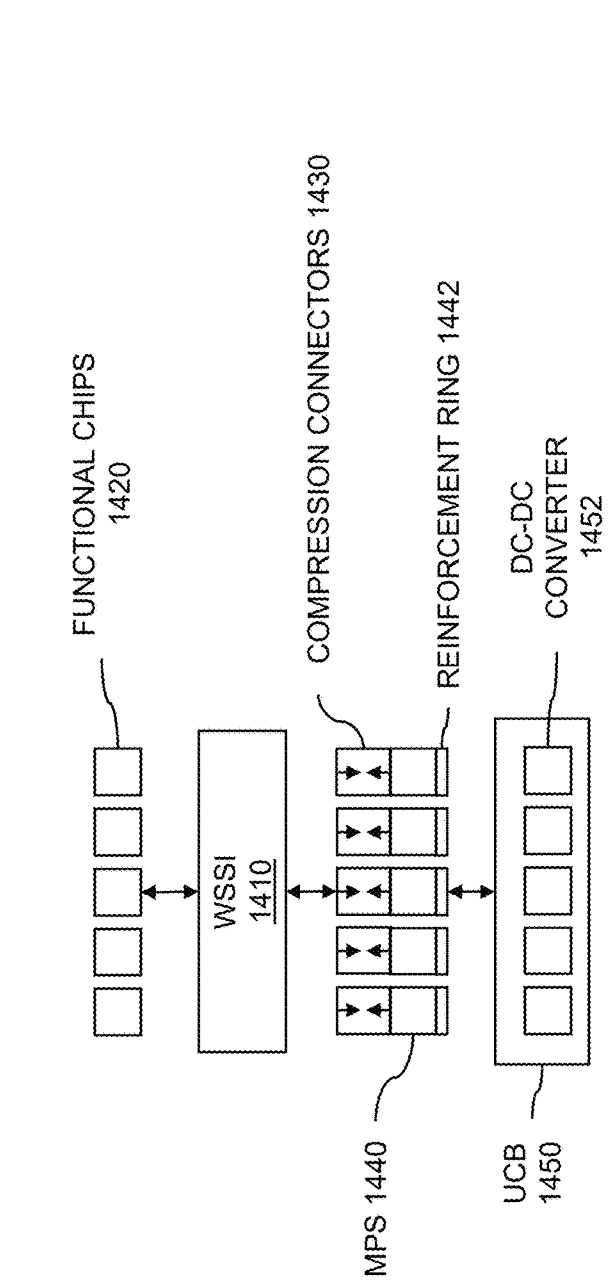
FIG. 14 is a system diagram for back side power delivery for wafer-scale integration with solderless modular power substrates.

FIG. 14 is a system diagram for back side power delivery for wafer-scale integration with solderless modular power substrates. The solderless modular power substrates accomplish stiffening of a wafer-scale silicon interposer (WSSI) and provide power to the WSSI. Recall that the WSSI can be bonded to a plurality of functional chips. The functional chips can include processors, multiprocessors, machine learning (ML) processors, graphics processors, memories, and so on. The functional chips can be bonded to a front side of the WSSI. The functional chips can be in communication with elements such as modular power substrates (MPSs) that can be attached to a back side of the WSSI. The communication between the functional chips and the MPSs can be accomplished using through-silicon vias (TSVs). To enable the fabrication of the TSVs and to improve the reliability of the TSVs, the WSSI can be ground, polished, and so on to reduce the thickness of the WSSI. The resulting thin WSSI can be delicate and therefore susceptible to cracking and fracturing. The solderless modular power substrates are attached to the back side of the WSSI based on a plurality of compression connectors. The attaching is based on a compression force from a unified control board (UCB). The attaching couples the MPS to one or more functional chips bonded to the front side of the WSSI. The solderless modular power substrates can provide stiffening to the WSSI to assist with protecting the WSSI from cracks and fractures.

Disclosed is a system for power delivery comprising: a wafer-scale silicon interposer (WSSI), wherein a front side of the WSSI is bonded to a plurality of functional chips, wherein the WSSI includes a plurality of through-silicon vias (TSVs); a plurality of modular power substrates (MPSs), wherein the plurality of MPSs is attached to a back side of the WSSI by a plurality of compression connectors; and a unified circuit board (UCB), wherein the UCB is mechanically connected to the plurality of MPSs, wherein the UCB includes a plurality of DC-to-DC converters, and wherein the UCB comprises a compression plate for the plurality of compression connectors, wherein the system, when provided DC power, is configured to: send DC power to the plurality of functional chips bonded to the WSSI, wherein the sending is based on the plurality of DC-to-DC converters, the plurality of MPSs, and the plurality of TSVs.

The system 1400 includes a wafer-scale silicon interposer (WSSI) 1410, wherein a front side of the WSSI is bonded to a plurality of functional chips, wherein the WSSI includes a plurality of through-silicon vias (TSVs). The WSSI can comprise an inorganic wafer such as a silicon wafer, a glass wafer, and so on. The WSSI can include an organic wafer. The plurality of functional chips 1420 can include general purpose chips such as processor chips, multiprocessor chips, graphics processor chips, application-specific integrated circuits (ASICS), systems-on-chip (SoCs), memory chips, artificial intelligence (AI) and machine learning (ML) accelerators, and so on. The plurality of functional chips can create prodigious heat during operation. The heat can be due to current provided to the functional chips such as active current, overcurrent, leakage current, and so on. The heat can result from IR drops associated with interconnect, active devices, leakage current, etc. within the functional chips. The functional chips can be bonded to the WSSI via micro-bumps, controlled collapse chip connections (C4s), and so on. The WSSI includes a plurality of through-silicon vias (TSVs). A TSV can include an electrical connection that completely passes through a wafer such as a silicon wafer or a die. The plurality of TSVs is oriented vertically in order to enable connections between the front side of the wafer and the back side of the wafer.

The system 1400 includes a plurality of modular power substrates (MPSs), wherein the plurality of MPSs is attached to a back side of the WSSI by a plurality of compression connectors. Described previously and throughout, the MPSs 1440 can include one or more DC-to-DC converters, a high voltage socket, one or more rigid-flex strips, and so on. In embodiments, each MPS within the plurality of MPSs is based on a form factor mirroring one or more corresponding functional chips, within the plurality of functional chips, on the front side of the WSSI. The one or more MPSs are attached to the back side of the WSSI through a reinforcement ring 1442 on each MPS within the plurality of MPSs. The reinforcement ring accomplishes stiffening each MPS in the plurality of MPSs.

The plurality of MPSs is attached to a back side of the WSSI by a plurality of compression connectors 1430. The compression connectors can enable connections between the WSSI and the MPSs. The compression connectors can be based on one or more compression connector types. In embodiments, the plurality of compression connectors includes a plurality of spring-loaded pins. The spring-loaded pins can be deflected when a contact, pad, TSV, etc. comes into contact with the spring-loaded pin. The spring-loaded pin can enable a reliable connection to the WSSI. In other embodiments, the plurality of compression connectors includes a plurality of wire nest contacts. A wire nest contact can include a braid of wire that forms a contact to a pad or other contact when the wire nest is compressed. In further embodiments, the plurality of compression connectors includes a plurality of elastomers with embedded balls. The embedded balls can enable electrical connections of the compression connectors. The elastomers associated with the compression connectors can flex under lateral displacement of the MPSs relative to the WSSI based on different coefficients of thermal expansion associated with the MPSs and the WSSI.

The system 1400 includes a unified circuit board (UCB) 1450, wherein the UCB is mechanically connected to the plurality of MPSs, wherein the UCB includes a plurality of DC-to-DC converters, and wherein the UCB comprises a compression plate for the plurality of compression connectors. The UCB is connected mechanically to the plurality of MPSs. The connection can be accomplished using a variety of connection techniques, where the connection techniques can be accomplished using locking connectors, non-locking connectors, and so on. The connectors can include rigid connectors, flexible connectors, and the like. The mechanical connection can be based on a high-power socket (which can be a high voltage socket), one or more rigid-flex strips, and so on. The modularity of the MPSs can allow for movement between the UCB and the WSSI. Movement, such as a linear displacement, can occur due to differences in coefficients of thermal expansion (CTE). The USB can include one or more control circuits. The control circuits can be used to generate control signals to one or more functional chips, enable transfers of data, control DC-to-DC converters, and the like. The UCB includes a plurality of DC-to-DC power converters 1452. The DC-to-DC converters can convert DC power from a high DC voltage range, such as 48 volts to 54 volts, to a lower DC voltage range, such as 12 volts to 13.5 volts. The DC-to-DC converters can be mounted on a unified control board (UCB) 1450. The UCB can provide controls such as control signals, and power such as DC power, to the DC-to-DC converters. The UCB can comprise a single control board. The single control board can include an organic control board or an inorganic control board. The UCB can comprise multiple control boards and/or circuits. In embodiments, the UCB comprises a printed circuit board (PCB). In further embodiments, the PCB comprises ceramic. In some embodiments, the PCB comprises Aluminum Nitride. Aluminum Nitride can have a similar CTE to Silicon, reducing the lateral displacement between the WSSI and the UCB during operation.

The system 1400, when provided power, is configured to: send DC power to the plurality of functional chips bonded to the WSSI, wherein the sending is based on the plurality of DC-to-DC converters, the plurality of MPSs, and the plurality of TSVs. The sending can include the first voltage conversion, and the second voltage conversion as described above.

Each of the above methods may be executed on one or more processors on one or more computer systems. Embodiments may include various forms of distributed computing, client/server computing, and cloud-based computing. Further, it will be understood that the depicted steps or boxes contained in this disclosure's flow charts are solely illustrative and explanatory. The steps may be modified, omitted, repeated, or re-ordered without departing from the scope of this disclosure. Further, each step may contain one or more sub-steps. While the foregoing drawings and description set forth functional aspects of the disclosed systems, no particular implementation or arrangement of software and/or hardware should be inferred from these descriptions unless explicitly stated or otherwise clear from the context. All such arrangements of software and/or hardware are intended to fall within the scope of this disclosure.

The block diagrams and flowchart illustrations depict methods, apparatus, systems, and computer program products. The elements and combinations of elements in the block diagrams and flow diagrams show functions, steps, or groups of steps of the methods, apparatus, systems, computer program products and/or computer-implemented methods. Any and all such functions—generally referred to herein as a "circuit," "module," or "system"—may be implemented by computer program instructions, by special-purpose hardware-based computer systems, by combinations of special purpose hardware and computer instructions, by combinations of general-purpose hardware and computer instructions, and so on.

A programmable apparatus which executes any of the above-mentioned computer program products or computer-implemented methods may include one or more microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are limited to neither conventional computer applications nor the programmable apparatus that run them. To illustrate: the embodiments of the presently claimed invention could include an optical computer, quantum computer, analog computer, or the like. A computer program may be loaded onto a computer to produce a particular machine that may perform any and all of the depicted functions. This particular machine provides a means for carrying out any and all of the depicted functions.

Any combination of one or more computer readable media may be utilized including but not limited to: a non-transitory computer readable medium for storage; an electronic, magnetic, optical, electromagnetic, infrared, or semiconductor computer readable storage medium or any suitable combination of the foregoing; a portable computer diskette; a hard disk; a random access memory (RAM); a read-only memory (ROM); an erasable programmable read-only memory (EPROM, Flash, MRAM, FeRAM, or phase change memory); an optical fiber; a portable compact disc; an optical storage device; a magnetic storage device; or any suitable combination of the foregoing. In the context of this document, a computer readable storage medium may be any tangible medium that can contain or store a program for use by or in connection with an instruction execution system, apparatus, or device.

It will be appreciated that computer program instructions may include computer executable code. A variety of languages for expressing computer program instructions may include without limitation C, C++, Java, JavaScript™, ActionScript™, assembly language, Lisp, Perl, Tcl, Python, Ruby, hardware description languages, database programming languages, functional programming languages, imperative programming languages, and so on. In embodiments, computer program instructions may be stored, compiled, or interpreted to run on a computer, a programmable data processing apparatus, a heterogeneous combination of processors or processor architectures, and so on. Without limitation, embodiments of the present invention may take the form of web-based computer software, which includes client/server software, software-as-a-service, peer-to-peer software, or the like.

In embodiments, a computer may enable execution of computer program instructions including multiple programs or threads. The multiple programs or threads may be processed approximately simultaneously to enhance utilization of the processor and to facilitate substantially simultaneous functions. By way of implementation, any and all methods, program codes, program instructions, and the like described herein may be implemented in one or more threads which may in turn spawn other threads, which may themselves have priorities associated with them. In some embodiments, a computer may process these threads based on priority or other order.

Unless explicitly stated or otherwise clear from the context, the verbs “execute” and “process” may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States, then the method is considered to be performed in the United States by virtue of the causal entity.

While the invention has been disclosed in connection with preferred embodiments shown and described in detail, various modifications and improvements thereon will become apparent to those skilled in the art. Accordingly, the foregoing examples should not limit the spirit and scope of the present invention; rather it should be understood in the broadest sense allowable by law.

What is claimed is:

1. A method for power delivery comprising:

accessing a wafer-scale silicon interposer (WSSI), wherein a front side of the WSSI is bonded to a plurality of functional chips, wherein the WSSI includes a plurality of through-silicon vias (TSVs);

connecting mechanically a plurality of modular power substrates (MPSs) to a unified control board (UCB), wherein the UCB includes a plurality of DC-to-DC power converters;

attaching, to a back side of the WSSI, the plurality of MPSs, wherein the attaching is based on a plurality of compression connectors, wherein the attaching is based on a compression force from the UCB, and wherein the attaching couples each MPS to one or more functional chips within the plurality of functional chips; and sending DC power, by the UCB, to the plurality of functional chips, wherein the sending is based on the plurality of DC-to-DC power converters, the plurality of MPSs, and the plurality of TSVs.

2. The method of claim 1 further comprising stiffening each MPS in the plurality of MPSs wherein the stiffening is based on a reinforcement ring on each MPS within the plurality of MPSs.

3. The method of claim 2 further comprising depositing, on each MPS within the plurality of MPSs, the reinforcement ring.

4. The method of claim 2 further comprising gluing, to each MPS within the plurality of MPSs, the reinforcement ring.

5. The method of claim 2 wherein the reinforcement ring on each MPS within the plurality of MPSs maintains a coplanarity of each MPS in the plurality of MPSs.

6. The method of claim 2 wherein the UCB includes a plurality of compression prongs, wherein the plurality of compression prongs contacts the reinforcement ring on each MPS in the plurality of MPSs.

7. The method of claim 6 wherein the attaching includes applying a compression force to the UCB, wherein the compression force is delivered to the plurality of compression connectors by the compression prongs.

8. The method of claim 1 wherein the plurality of compression connectors includes a plurality of spring-loaded pins.

9. The method of claim 1 wherein the plurality of compression connectors includes a plurality of wire nest contacts.

10. The method of claim 1 wherein the plurality of compression connectors includes a plurality of elastomers with embedded balls.

11. The method of claim 1 wherein the plurality of compression connectors includes a plurality of cantilever contacts.

12. The method of claim 1 wherein the UCB comprises a compression plate.

13. The method of claim 1 wherein the UCB comprises a printed circuit board (PCB).

14. The method of claim 13 wherein the PCB comprises ceramic.

15. The method of claim 14 wherein the PCB comprises Aluminum Nitride.

16. The method of claim 1 further comprising creating a plurality of grooves on the back side of the WSSI.

17. The method of claim 16 wherein each MPS in the plurality of MPSs includes an extension, wherein the extension included within each MPS is inserted in a groove in the plurality of grooves.

18. The method of claim 1 wherein the sending includes delivering the DC power, by the UCB, to the plurality of MPSs, wherein the delivering includes a first voltage conversion.

19. The method of claim 18 further comprising transferring the DC power that was delivered, by the plurality of MPSs, to the plurality of functional chips, wherein the transferring includes a second voltage conversion.

20. An apparatus for power delivery comprising:

a wafer-scale silicon interposer (WSSI), wherein a front side of the WSSI is bonded to a plurality of functional chips, wherein the WSSI includes a plurality of through-silicon vias (TSVs);

a plurality of modular power substrates (MPSs), wherein the plurality of MPSs is attached to a back side of the WSSI by a plurality of compression connectors; and a unified control board (UCB), wherein the UCB is mechanically connected to the plurality of MPSs, wherein the UCB comprises a compression plate for the plurality of compression connectors, wherein the UCB includes a plurality of DC-to-DC converters, wherein the UCB sends DC power to the plurality of functional chips bonded to the WSSI, and wherein the sending is based on the plurality of MPSs and the plurality of TSVs.

21. The apparatus of claim 20 further comprising a plurality of reinforcement rings, wherein each reinforcement ring in the plurality of reinforcement rings stiffens each MPS in the plurality of MPSs, respectively.

22. The apparatus of claim 21 further comprising a plurality of compression prongs, wherein the plurality of compression prongs contacts a reinforcement ring on each MPS in the plurality of MPSs.

23. The apparatus of claim 22 wherein the plurality of compression prongs applies a compression force to the UCB, wherein the compression force is delivered to the plurality of compression connectors.

24. The apparatus of claim 20 further comprising a plurality of grooves on the back side of the WSSI.

25. The apparatus of claim 24 wherein each MPS in the plurality of MPSs includes an extension, wherein the extension included in each MPS is inserted in a groove in the plurality of grooves.

26. A system for power delivery comprising:

a wafer-scale silicon interposer (WSSI), wherein a front side of the WSSI is bonded to a plurality of functional chips, wherein the WSSI includes a plurality of through-silicon vias (TSVs);

a plurality of modular power substrates (MPSs), wherein the plurality of MPSs is attached to a back side of the WSSI by a plurality of compression connectors; and a unified circuit board (UCB), wherein the UCB is mechanically connected to the plurality of MPSs, wherein the UCB includes a plurality of DC-to-DC converters, and wherein the UCB comprises a compression plate for the plurality of compression connectors, wherein the system, when provided DC power, is configured to:

send DC power to the plurality of functional chips bonded to the WSSI, wherein the sending is based on the plurality of DC-to-DC converters, the plurality of MPSs, and the plurality of TSVs.

* * * * *